(12) United States Patent
Ogawa

(10) Patent No.: US 12,080,206 B2
(45) Date of Patent: Sep. 3, 2024

(54) METHOD FOR REPAIRING DISPLAY DEVICE AND DISPLAY DEVICE

(71) Applicant: Japan Display Inc., Tokyo (JP)

(72) Inventor: Akihiro Ogawa, Tokyo (JP)

(73) Assignee: Japan Display Inc., Tokyo (JP)

(*) Notice: Subject to any disclaimer, the term of this patent is extended or adjusted under 35 U.S.C. 154(b) by 205 days.

(21) Appl. No.: 17/700,631

(22) Filed: Mar. 22, 2022

(65) Prior Publication Data

US 2022/0215784 A1  Jul. 7, 2022

Related U.S. Application Data

(63) Continuation of application No. PCT/JP2020/030487, filed on Aug. 7, 2020.

(30) Foreign Application Priority Data

Sep. 24, 2019 (JP) .................... 2019-173057

(51) Int. Cl.
*G09G 3/00* (2006.01)
*H01L 27/15* (2006.01)
(Continued)

(52) U.S. Cl.
CPC .......... *G09G 3/006* (2013.01); *H01L 27/156* (2013.01); *H01L 33/38* (2013.01); *H01L 33/62* (2013.01)

(58) Field of Classification Search
CPC ........ G09G 3/00; G09G 3/006; G09G 3/3233; G09G 2300/0852; G09G 2310/0251;
(Continued)

(56) References Cited

U.S. PATENT DOCUMENTS 10,515,580 B2  12/2019  Henry et al.
2018/0226388 A1*  8/2018  Han .................. H01L 27/1248
2020/0035750 A1  1/2020  Li

FOREIGN PATENT DOCUMENTS

CN  109003996 A  12/2018
JP  2006-065011 A  3/2006
(Continued)

OTHER PUBLICATIONS

International Search Report mailed on Oct. 13, 2020, for the corresponding PCT Application No. PCT/JP2020/030487, with English translation.
(Continued)

*Primary Examiner* — Eman A Alkafawi
*Assistant Examiner* — Courtney G McDonnough
(74) *Attorney, Agent, or Firm* — Michael Best & Friedrich LLP

(57) ABSTRACT

A method for repairing a display device, the display device comprising: a plurality of inorganic light emitters arrayed in a matrix (row-column configuration); and a counter electrode provided in a traveling direction of light emitted from the inorganic light emitters and coupled to the inorganic light emitters, the method comprising steps of: detecting a defective inorganic light emitter serving as one of the inorganic light emitters and having a defect; and removing a target portion of the counter electrode by irradiating the target portion with light while leaving the defective inorganic light emitter unremoved, the target portion including a portion between a portion coupled to the defective inorganic light emitter and a portion coupled to an inorganic light emitter adjacently disposed with the defective inorganic light emitter.

7 Claims, 14 Drawing Sheets

(51) Int. Cl.
*H01L 33/38* (2010.01)
*H01L 33/62* (2010.01)

(58) Field of Classification Search
CPC . G09G 2310/0262; H01L 27/15; H01L 33/38; H01L 33/62; H01L 25/0753; H01L 27/156; H01L 25/167; H01L 2933/0066; H01L 33/0095; H01L 27/124; H01L 27/1214; H01L 27/1288; H01L 2933/0033; H01L 2933/005; H01L 33/48; H01L 33/52; H01L 21/18; H01L 21/302; H01L 21/76802; H01L 21/77; H01L 23/31; H01L 27/1218; H01L 27/1251; H01L 27/1255; H01L 27/1277; H01L 29/78606; H01L 29/78633; H01L 2924/0002; H01L 33/20; H01L 33/24; H01L 33/60; H01L 22/00; H01L 25/00; H01L 24/00; H01L 23/00; H01L 31/00; H01L 2933/00; H01L 2223/00; G09F 9/00; H10K 71/00; H10K 71/861; H10K 50/844; H10K 50/80; H10K 59/131; H10K 71/70; H10K 85/00; H10K 59/122; H10K 59/12; H10K 59/1201; H10K 59/123; H10K 59/126; H10K 59/1213; H10K 50/822; H10K 59/121; H10K 50/81; H10K 59/125; H10K 59/124; H10K 2102/00; H10K 50/841; H10K 50/86; H10K 77/111; H10K 2102/351; H10K 50/813; H10K 50/824; H10K 50/8426; H10K 59/1216; H10K 59/35; H10K 59/65; H10K 50/828; H10K 50/84; H10K 50/868; H10K 59/40; H10K 59/88; H10K 2101/30; H10K 2102/311; H10K 50/13; H10K 50/15; H10K 50/8423; H10K 50/852; H10K 50/856; H10K 50/87; H10K 59/30; H10K 59/353; H10K 71/166; H10K 71/421; H10K 71/80; H10K 71/851; H10K 85/10; H10K 50/805; H10K 50/826; H10K 50/85; H10K 50/858; H10K 50/865; H10K 59/00; H10K 59/1315; H10K 59/351; H10K 59/38; H10K 59/60; H10K 59/80521; H10K 59/871; H10K 59/873; H10K 59/879; H10K 59/8792; H10K 71/231; H10K 71/441; H10K 77/10; G02B 1/14; G02B 5/10; G02F 1/133528; G02F 1/1368; H05B 33/10

USPC .......................................................... 324/537

See application file for complete search history.

(56) References Cited

FOREIGN PATENT DOCUMENTS

| JP | 2006-323032 A | 11/2006 |
| JP | 2017-529557 A | 10/2017 |

OTHER PUBLICATIONS

Notification of Examination Opinions for Taiwanese Patent Application No. 109132884, dated May 11, 2021, with English translation.

* cited by examiner

FIG.6
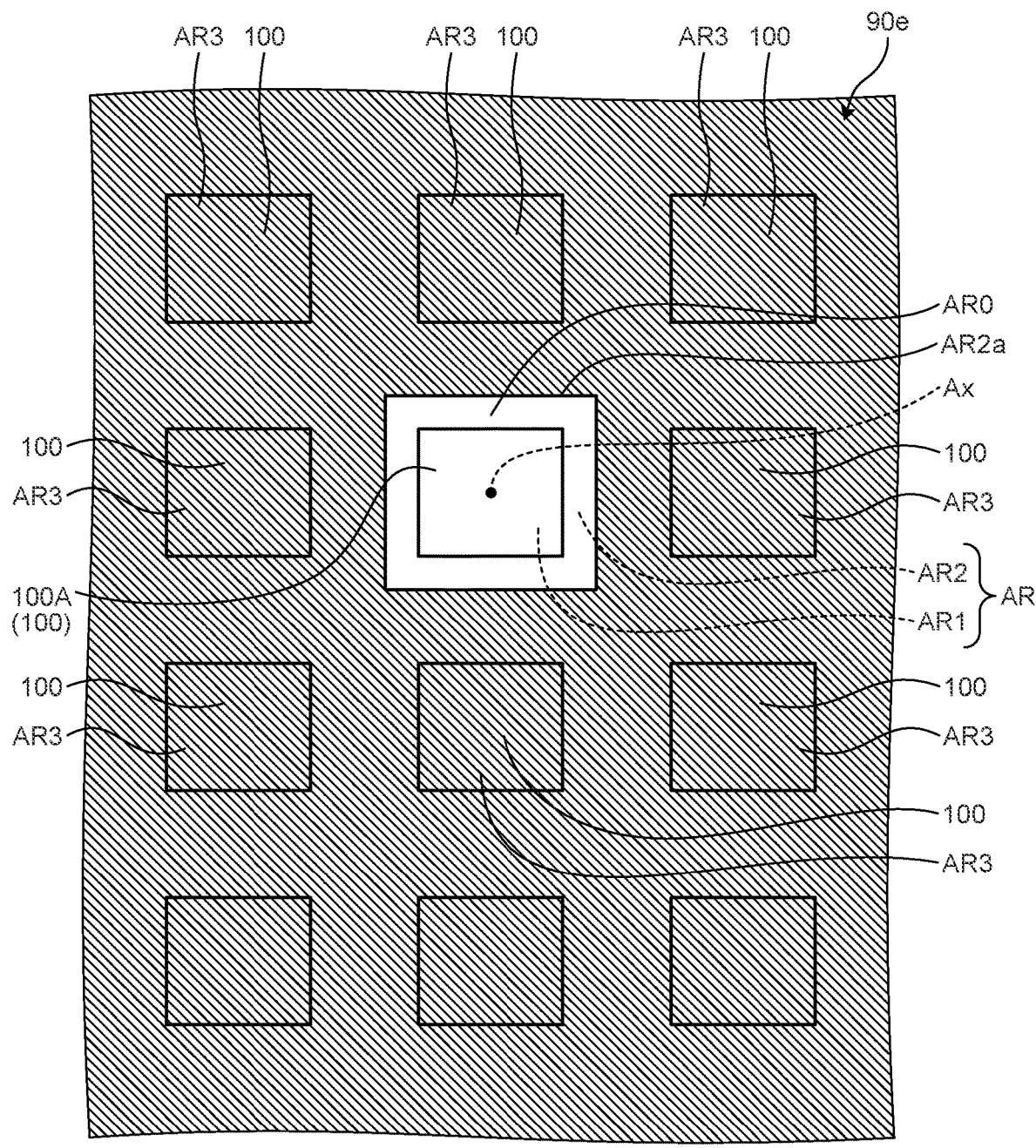
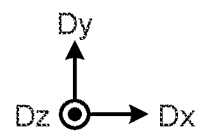

METHOD FOR REPAIRING DISPLAY DEVICE AND DISPLAY DEVICE

CROSS-REFERENCE TO RELATED APPLICATION

This application is a continuation of International Patent Application No. PCT/JP2020/030487 filed on Aug. 7, 2020 which designates the United States, incorporated herein by reference, and which claims the benefit of priority from Japanese Patent Application No. 2019-173057 filed on Sep. 24, 2019, incorporated herein by reference.

BACKGROUND

1. Technical Field

The present invention relates to a method for repairing a display device and the display device.

2. Description of the Related Art

Display devices including micro-sized light-emitting diodes (micro LEDs) serving as display elements have recently been attracting attention (refer to Japanese Patent Application Laid-open Publication No. 2017-529557 (JP-A-2017-529557), for example). The light-emitting diodes are coupled to an array substrate (driver backplane in JP-A-2017-529557), and the array substrate includes a pixel circuit (electronic control circuit in JP-A-2017-529557) that drives the light-emitting diodes.

Display devices including light-emitting diodes, however, are difficult to manufacture in mounting the light-emitting diodes on a substrate, for example, because of the small size of the light-emitting diodes and tend to have defects in the light-emitting diodes. If display devices having defects are not used by being discarded, for example, the yield decreases. For this reason, there is a need to appropriately make display devices including light-emitting diodes usable if they have defects.

In view of the disadvantages described above, an object of the present invention is to provide a method for repairing a display device that can be appropriately made usable if it has defects and the display device.

SUMMARY

A method according to an embodiment for repairing a display device is disclosed. The display device includes a plurality of inorganic light emitters arrayed in a matrix (row-column configuration), and a counter electrode provided in a traveling direction of light emitted from the inorganic light emitters and coupled to the inorganic light emitters. The method includes steps of detecting a defective inorganic light emitter serving as one of the inorganic light emitters and having a defect, and removing a target portion of the counter electrode by irradiating the target portion with light while leaving the defective inorganic light emitter unremoved, the target portion including a portion between a portion coupled to the defective inorganic light emitter and a portion coupled to an inorganic light emitter adjacently disposed with the defective inorganic light emitter.

A display device according to an embodiment of the present disclosure includes a plurality of inorganic light emitters arrayed in a matrix (row-column configuration), and a counter electrode provided in a traveling direction of light emitted from the inorganic light emitters and coupled to the inorganic light emitters. The counter electrode has an opening at a portion provided with a first inorganic light emitter and a portion provided with a second inorganic light emitter adjacently disposed with the first inorganic light emitter when viewed from the traveling direction of light.

BRIEF DESCRIPTION OF THE DRAWINGS

FIG. 6 is a schematic of an example of repairing the display device;

DETAILED DESCRIPTION

Figure 1:
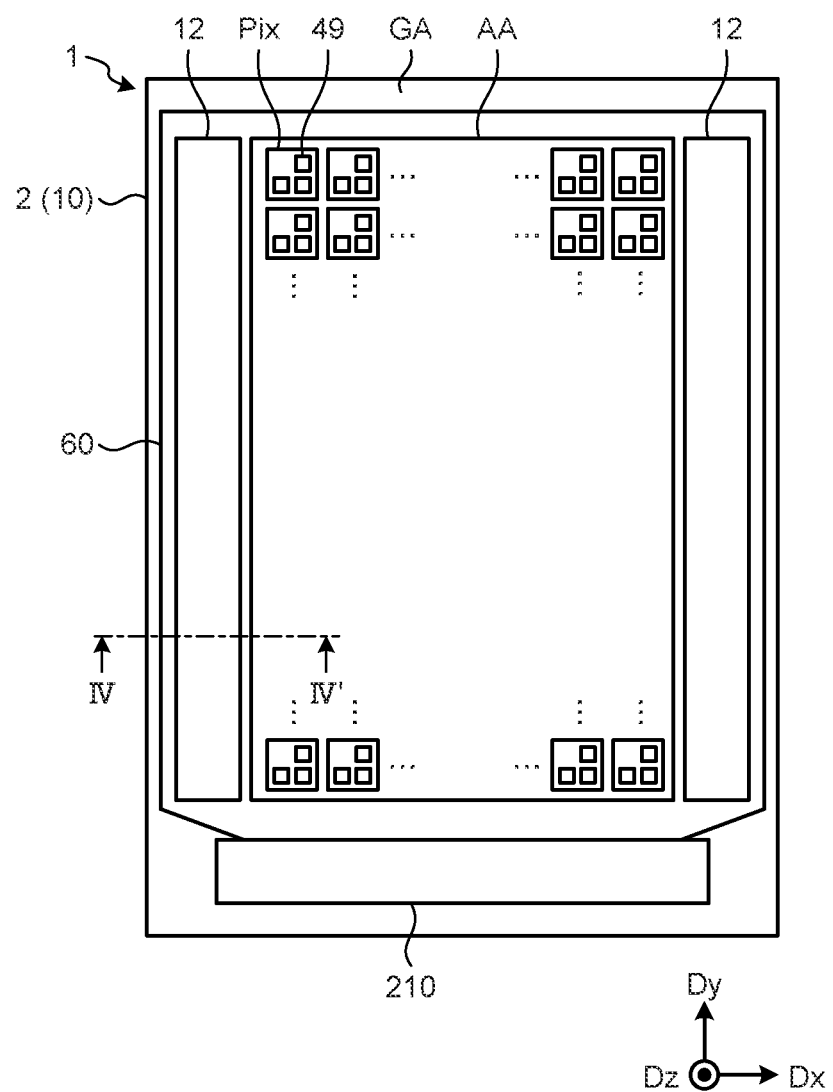
FIG. 1 is a plan view of an exemplary configuration of a display device according to the present embodiment.

Embodiment of the present invention is described below with reference to the accompanying drawings. What is disclosed herein is given by way of example only, and appropriate modifications made without departing from the spirit of the present invention and easily conceivable by those skilled in the art naturally fall within the scope of the present invention. To simplify the explanation, the drawings may possibly illustrate the width, the thickness, the shape, and other elements of each unit more schematically than the actual aspect. These elements, however, are given by way of example only and are not intended to limit interpretation of the present invention. In the present specification and the drawings, components similar to those previously described with reference to previous drawings are denoted by like reference numerals, and detailed explanation thereof may be appropriately omitted.

Configuration of the Display Device

FIG. 1 is a plan view of an exemplary configuration of a display device according to the present embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit substrate that drives the pixels Pix and is also called a backplane or an active matrix substrate. The array substrate 2 includes a substrate 10, a plurality of transistors, a plurality of capacitances, various kinds of wiring, and other components.

As illustrated in FIG. 1, the display device 1 has a display region AA and a peripheral region GA. The display region AA is a region provided with the pixels Pix and displays an image. The peripheral region GA does not overlap the pixels Pix and is positioned outside the display region AA.

The pixels Pix are arrayed in a first direction Dx and a second direction Dy in the display region AA of the substrate 10. The first direction Dx and the second direction Dy are parallel to a first surface 10a (refer to FIG. 4) of the substrate 10 of the array substrate 2. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 10, for example. In the following description, planar view indicates the positional relation viewed from the third direction Dz.

The drive circuits 12 are provided in the peripheral region GA of the substrate 10. The drive circuits 12 are circuits that drive a plurality of gate lines (e.g., a light emission control scanning line BG, a reset control scanning line RG, an initialization control scanning line IG, and a writing control scanning line SG (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 may be mounted in the peripheral region GA of the substrate 10 as chip on glass (COG). The mounting form of the drive IC 210 is not limited thereto, and the drive IC 210 may be mounted on a wiring substrate coupled to the peripheral region GA of the substrate 10 as chip on film (COF). The wiring substrate coupled to the substrate 10 is flexible printed circuits or a rigid substrate, for example.

The cathode wiring 60 is provided in the peripheral region GA of the substrate 10. The cathode wiring 60 is provided surrounding the pixels Pix in the display region AA and the drive circuits 12 in the peripheral region GA. Cathodes (cathode electrodes 114 (refer to FIG. 4)) of a plurality of inorganic light emitters 100 (refer to FIG. 4) are coupled to the common cathode wiring 60 and are supplied with a fixed potential (e.g., a ground potential). More specifically, the cathode electrode 114 of the inorganic light emitter 100 is coupled to the cathode wiring 60 via a counter cathode electrode 90e on the array substrate 2. A cathode wiring 14 may partially have a slit and be provided as two different wires on the substrate 10.

Figure 2:
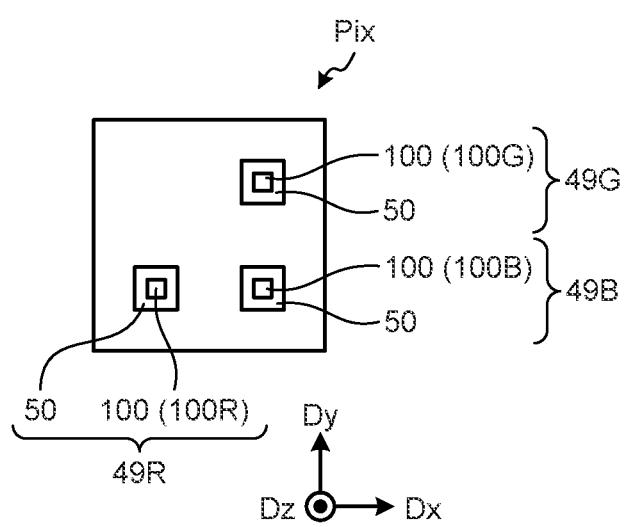
FIG. 2 is a plan view of a plurality of pixels.

FIG. 2 is a plan view of a plurality of pixels. As illustrated in FIG. 2, one pixel Pix includes a plurality of pixels 49. The pixel Pix includes a first pixel 49R, a second pixel 49G, and a third pixel 49B, for example. The first pixel 49R displays the primary color of red as a first color. The second pixel 49G displays the primary color of green as a second color. The third pixel 49B displays the primary color of blue as a third color. As illustrated in FIG. 2, the first pixel 49R and the third pixel 49B are adjacently disposed in the first direction Dx in one pixel Pix. The second pixel 49G and the third pixel 49B are adjacently disposed in the second direction Dy. The first color, the second color, and the third color are not limited to red, green, and blue, respectively, and may be any desired colors, such as complementary colors. In the following description, the first pixel 49R, the second pixel 49G, and the third pixel 49B are referred to as pixels 49 when they need not be distinguished from one another. The number of pixels 49 included in one pixel Pix is not limited to three, and four or more pixels 49 may be included in one pixel Pix. The pixel Pix may include a fourth pixel 49W that displays white as a fourth color, for example. The arrangement of the pixels 49 is not limited to the configuration illustrated in FIG. 2. The first pixel 49R, for example, may be adjacently disposed with the second pixel 49G in the first direction Dx. The first pixel 49R, the second pixel 49G, and the third pixel 49B may be repeatedly arrayed in this order in the first direction Dx.

Each pixel 49 includes one inorganic light emitter 100. The display device 1 displays an image by outputting different light from the respective inorganic light emitters 100 in the first pixel 49R, the second pixel 49G, and the third pixel 49B. The inorganic light emitter 100 is an inorganic light-emitting diode (LED) chip having a size of approximately several micrometers to 300 micrometers in planar view. Typically, a light-emitting diode having a chip size of 100 micrometers or larger is called a mini LED, and a light-emitting diode having a chip size of several micrometers to smaller than 100 micrometers is called a micro LED. The present invention can use LEDs having any size and may choose the LEDs depending on the screen size (size of one pixel) of the display device. A display device including micro LEDs in respective pixels is also called a micro LED display device. The term "micro" of the micro LED is not intended to limit the size of the inorganic light emitter 100.

Figure 3:
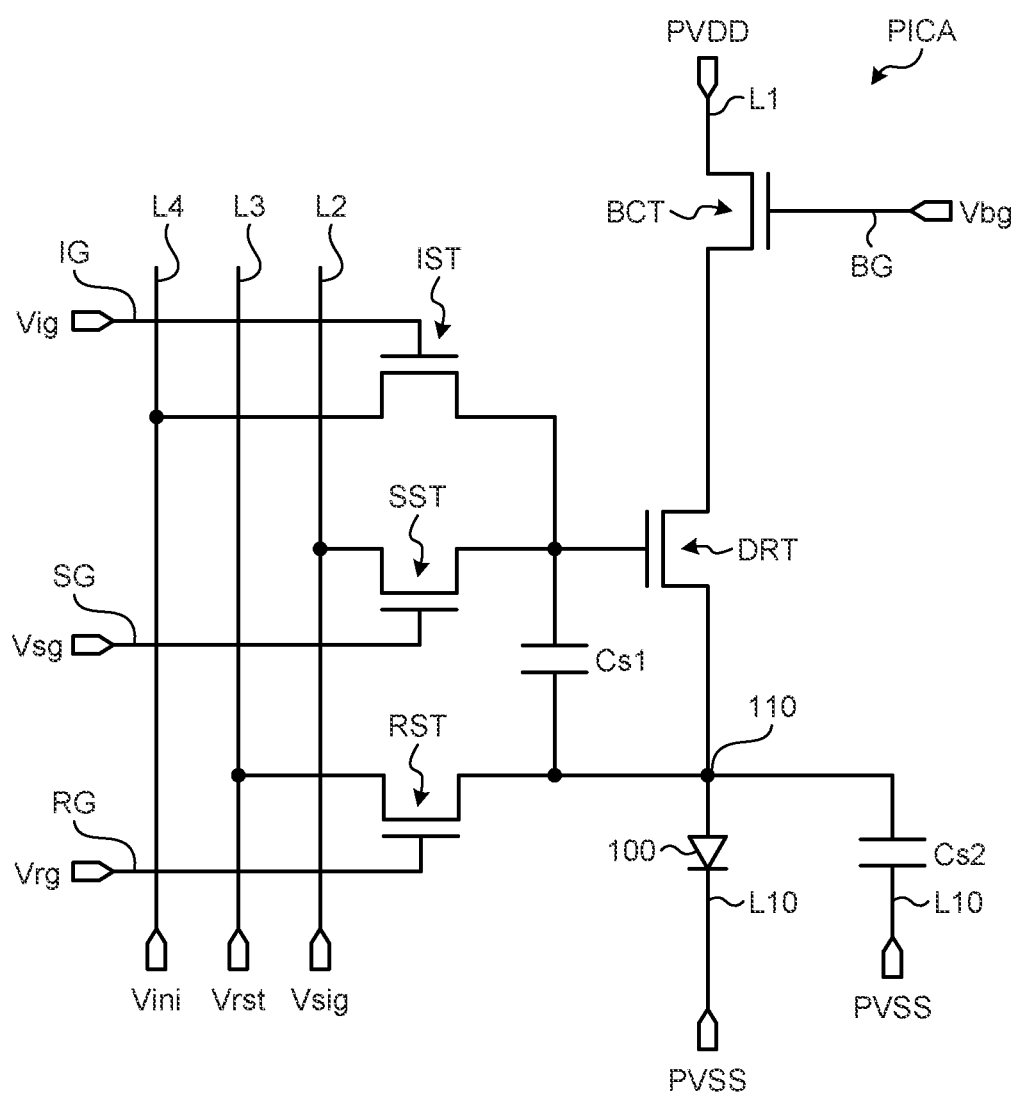
FIG. 3 is a circuit diagram of an exemplary configuration of a pixel circuit of the display device.

FIG. 3 is a circuit diagram of an exemplary configuration of a pixel circuit of the display device. A pixel circuit PICA illustrated in FIG. 3 is provided to each of the first pixel 49R, the second pixel 49G, and the third pixel 49B. The pixel circuit PICA is provided to the substrate 10 and supplies drive signals (electric current) to the inorganic light emitter 100. The explanation of the pixel circuit PICA with reference to FIG. 3 is applicable to the respective pixel circuits PICA included in the first pixel 49R, the second pixel 49G, and the third pixel 49B.

As illustrated in FIG. 3, the pixel circuit PICA includes the inorganic light emitter 100, five transistors, and two capacitances. Specifically, the pixel circuit PICA includes a light emission control transistor BCT, an initialization transistor IST, a writing transistor SST, a reset transistor RST, and a drive transistor DRT. Some of the transistors may be shared by the pixels 49 disposed adjacently. The light emission control transistor BCT, for example, may be shared by three pixels 49 via common wiring. The reset transistors RST may be provided in the peripheral region GA and be each provided to one row of the pixels 49, for example. In this case, the reset transistor RST is coupled to the drains of a plurality of drive transistors DRT via common wiring. The reset transistor RST may be coupled to the sources of the drive transistors DRT.

The transistors included in the pixel circuit PICA are composed of n-type thin-film transistors (TFTs). The present embodiment is not limited thereto, and the transistors may be composed of p-type TFTs. To use p-type TFTs, the coupling form of a power supply potential, holding capacitance Cs1, and capacitance Cs2 may be appropriately employed.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST.

The light emission control scanning line BG, the initialization control scanning line IG, the writing control scanning line SG, and the reset control scanning line RG are coupled to the drive circuits 12 (refer to FIG. 1). The drive circuits 12 supply light emission control signals Vbg, initialization control signals Vig, writing control signals Vsg, and reset control signals Vrg to the light emission control scanning line BG, the initialization control scanning line IG, the writing control scanning line SG, and the reset control scanning line RG, respectively.

The drive IC 210 (refer to FIG. 1) supplies video signals Vsig to the respective pixel circuits PICA of the first pixel 49R, the second pixel 49G, and the third pixel 49B in a time-division manner. A switching circuit, such as a multiplexer, is provided between each row of the first pixels 49R, the second pixels 49G, and the third pixels 49B and the drive IC 210. The video signals Vsig are supplied to the writing transistor SST via a video signal line L2. The drive IC 210 supplies a reset power supply potential Vrst to the reset transistor RST via a reset signal line L3. The drive IC 210 supplies an initialization potential Vini to the initialization transistor IST via an initialization signal line L4.

The light emission control transistor BCT, the initialization transistor IST, the writing transistor SST, and the reset transistor RST each function as a switching element that selects electrical continuity and discontinuity between two nodes. The drive transistor DRT functions as an electric current control element that controls an electric current flowing through the inorganic light emitter 100 based on voltage between the gate and the drain.

The cathode (cathode electrode 114) of the inorganic light emitter 100 is coupled to a cathode power supply line L10. The anode (anode electrode 112) of the inorganic light emitter 100 is coupled to an anode power supply line L1 (first power supply line) via the drive transistor DRT and the light emission control transistor BCT. The anode power supply line L1 is supplied with an anode power supply potential PVDD (first potential). The cathode power supply line L10 is supplied with a cathode power supply potential PVSS (second potential). The anode power supply potential PVDD is higher than the cathode power supply potential PVSS. The cathode power supply line L10 includes the cathode wiring 60.

The pixel circuit PICA includes the capacitance Cs1 and the capacitance Cs2. The capacitance Cs1 is capacitance formed between the gate and the source of the drive transistor DRT. The capacitance Cs2 is an additional capacitance formed between the cathode power supply line L10 and both the source of the drive transistor DRT and the anode of the inorganic light emitter 100.

The pixel circuit PICA may include a transistor CCT between the light emission control transistor BCT and the drive transistor DRT. In this case, the source of the transistor CCT is coupled to the drain of the light emission control transistor BCT, and the drain of the transistor CCT is coupled to the source of the drive transistor DRT. The gate of the transistor CCT is coupled to wiring CG that supplies an electric potential to the gate of the transistor CCT. When an electric potential is supplied to the gate of the transistor CCT via the wiring CG, the drain of the light emission control transistor BCT and the source of the drive transistor DRT are brought into an electrically continuous state: and when no electric potential is supplied to the gate of the transistor CCT via the wiring CG, the drain of the light emission control transistor BCT and the source of the drive transistor DRT are brought into an electrically discontinuous state.

The display device 1 drives the pixels 49 in the first row to the pixels 49 in the last row, thereby displaying an image of one frame in one frame period.

In a reset period, the electric potential of the light emission control scanning line BG is switched to an L (low) level, and the electric potential of the reset control scanning line RG is switched to an H (high) level by the control signals supplied from the drive circuits 12. As a result, the light emission control transistor BCT is turned off (electrically discontinuous state), and the reset transistor RST is turned on (electrically continuous state).

As a result, electric charges remaining in the pixel 49 flow to the outside via the reset transistor RST, and the source of the drive transistor DRT is fixed to the reset power supply potential Vrst. The reset power supply potential Vrst is set with a predetermined potential difference with respect to the cathode power supply potential PVSS. The potential difference between the reset power supply potential Vrst and the cathode power supply potential PVSS is smaller than the potential difference at which the inorganic light emitter 100 starts to emit light.

Subsequently, the electric potential of the initialization control scanning line IG is switched to the H level by the control signals supplied from the drive circuits 12. The initialization transistor IST is turned on. The gate of the drive transistor DRT is fixed to the initialization potential Vini via the initialization transistor IST.

Subsequently, the electric potential of the initialization control scanning line IG is switched to the H level by the control signals supplied from the drive circuits 12. The initialization transistor IST is turned on. The gate of the drive transistor DRT is fixed to the initialization potential Vini via the initialization transistor IST.

The drive circuits 12 turn on the light emission control transistor BCT and turn off the reset transistor RST. When the source potential is equal to (Vini−Vth), the drive transistor DRT is turned off. As a result, a threshold voltage Vth of the drive transistor DRT can be acquired for each of the pixels 49, whereby variations in the threshold voltage Vth of the respective pixels 49 are offset.

In a subsequent video signal writing operation period, the light emission control transistor BCT is turned off, the initialization transistor IST is turned off, and the writing transistor SST is turned on by the control signals supplied from the drive circuits 12. The video signals Vsig are input to the gate of the drive transistor DRT in each of the pixels 49 belonging to one row. The video signal line L2 extends in the second direction Dy and is coupled to the pixels 49 in a plurality of rows belonging to the same column. As a result, the video signal writing operation period is performed row by row.

In a subsequent light emission operation period, the light emission control transistor BCT is turned on, and the writing transistor SST is turned off by the control signals supplied from the drive circuits 12. The anode power supply potential PVDD is supplied to the drive transistor DRT from the anode power supply line L1 via the light emission control transistor BCT. The drive transistor DRT supplies an electric current corresponding to the gate-source voltage to the inorganic light emitter 100. The inorganic light emitter 100 emits light with the luminance corresponding to the electric current.

The drive circuits 12 may drive the pixels 49 row by row, simultaneously drive the pixels 49 in two rows, or simultaneously drive the pixels 49 in three or more rows.

The configuration of the pixel circuit PICA illustrated in FIG. 3 is given by way of example only and can be appropriately changed. The number of wires and the number of transistors in one pixel 49, for example, may be different from those illustrated in FIG. 3. The pixel circuit PICA may have a configuration of a current mirror circuit or the like.

Figure 4:
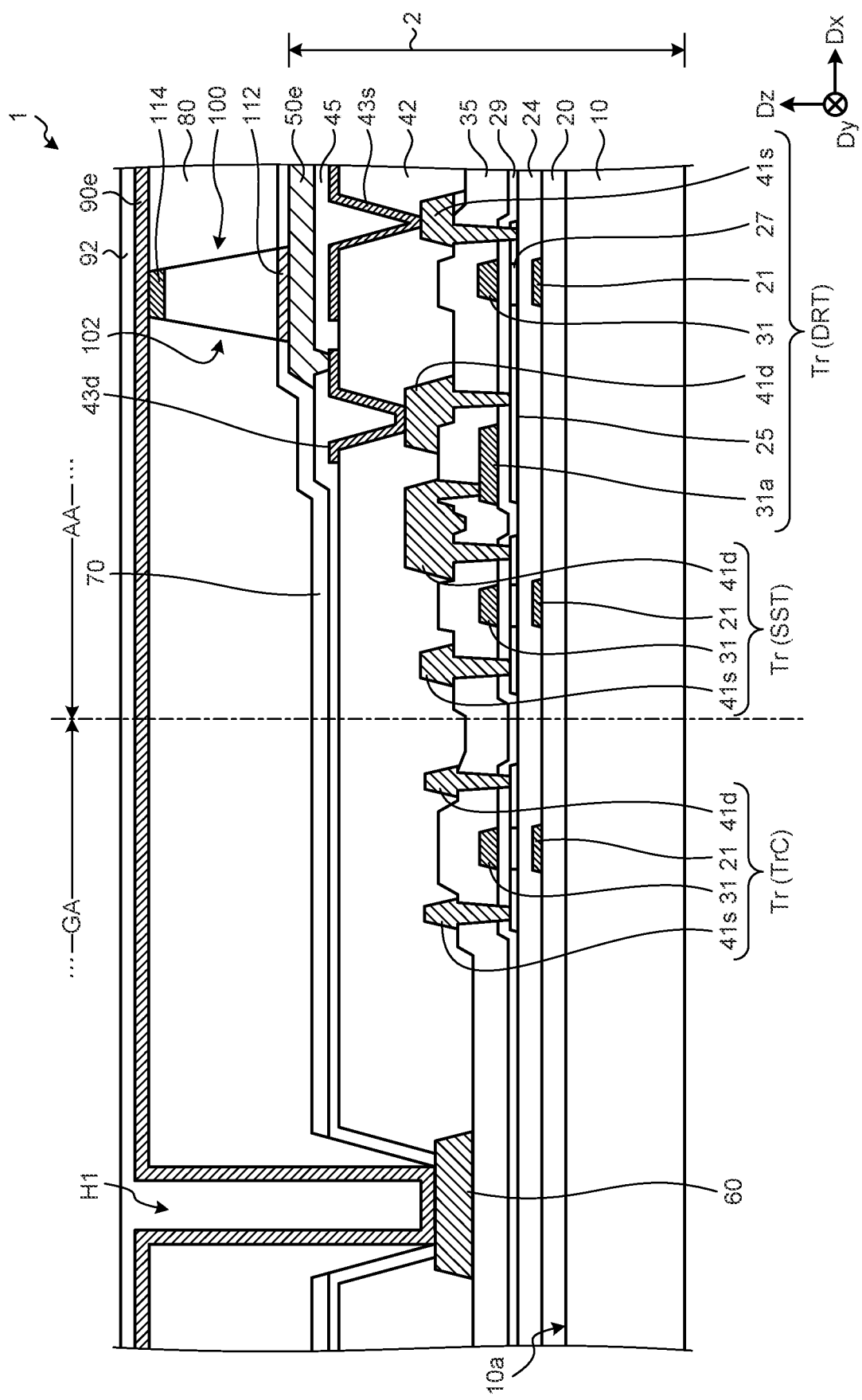
FIG. 4 is a sectional view along line IV-IV' of FIG. 1.

FIG. 4 is a sectional view along line IV-IV' of FIG. 1. As illustrated in FIG. 4, the array substrate 2 of the display device 1 includes the substrate 10 and a plurality of transistors. The substrate 10 has a first surface 10a and a second surface 10b opposite to the first surface 10a. The substrate 10 is an insulating substrate and is, for example, a glass substrate, a quartz substrate, or a flexible substrate made of acrylic resin, epoxy resin, polyimide resin, or polyethylene terephthalate (PET) resin.

In the present specification, a direction from the substrate 10 toward the inorganic light emitter 100 in a direction perpendicular to the surface of the substrate 10 is referred to as an "upper side" or simply as "on". A direction from the inorganic light emitter 100 toward the substrate 10 is referred to as a "lower side" or simply as "under". To describe an aspect where a first structure is disposed on a second structure, the term "on" includes both of the following cases unless otherwise noted: a case where the first structure is disposed directly on the second structure such that it contacts the second structure, and a case where the first structure is disposed on the second structure with another structure interposed therebetween.

An undercoat layer 20 is provided on the first surface 10a of the substrate 10. A light-blocking layer may be provided on the first surface 10a of the substrate 10. In this case, the undercoat layer 20 covers the light-blocking layer. The light-blocking layer may be made of any desired material as long as it blocks light. The light-blocking layer is a molybdenum-tungsten alloy film, for example.

A plurality of transistors are provided on the undercoat layer 20. The drive transistor DRT and the writing transistor SST included in the pixel 49 are provided as the transistors in the display region AA of the substrate 10, for example. A transistor TrC included in the drive circuits 12 is provided as the transistors in the peripheral region GA of the substrate 10. While the drive transistor DRT, the writing transistor SST, and the transistor TrC out of the transistors are illustrated, the light emission control transistor BCT, the initialization transistor IST, and the reset transistor RST included in the pixel circuit PICA also have the same multilayered structure as that of the drive transistor DRT. In the following description, the transistors are simply referred to as transistors Tr when they need not be distinguished from one another.

The transistor Tr is a TFT having a dual-gate structure, for example. Each transistor Tr includes a first gate electrode 21, a second gate electrode 31, a semiconductor layer 25, a source electrode 41s, and a drain electrode 41d. The first gate electrode 21 is provided on the undercoat layer 20. An insulating film 24 is provided on the undercoat layer 20 and covers the first gate electrode 21. The semiconductor layer 25 is provided on the insulating film 24. The semiconductor layer 25 is made of polycrystalline silicon, for example. The material of the semiconductor layer 25 is not limited thereto and may be microcrystalline oxide semiconductor, amorphous oxide semiconductor, or low-temperature polycrystalline silicon, for example. An insulating film 29 is provided on the semiconductor layer 25. The second gate electrode 31 is provided on the insulating film 29.

The undercoat layer 20 and the insulating films 24, 29, and 45 are inorganic insulating films and are made of silicon oxide ($SiO_2$) or silicon nitride (SiN), for example. The first gate electrode 21 and the second gate electrode 31 face each other with the insulating film 24, the semiconductor layer 25, and the insulating film 29 interposed therebetween in the third direction Dz. The part of the insulating films 24 and 29 sandwiched by the first gate electrode 21 and the second gate electrode 31 functions as a gate insulating film. The part of the semiconductor layer 25 sandwiched by the first gate electrode 21 and the second gate electrode 31 serves as a channel region 27 of the transistor Tr. The part of the semiconductor layer 25 coupled to the source electrode 41s serves as a source region of the transistor Tr. The part of the semiconductor layer 25 coupled to the drain electrode 41d serves as a drain region of the transistor Tr. The part between the channel region 27 and the source region and the part between the channel region 27 and the drain region are each provided with a low-concentration impurity region. While n-type TFTs alone are illustrated as the transistors Tr, p-type TFTs may be simultaneously formed.

A gate line 31a is coupled to the second gate electrode 31 of the transistor DRT. The insulating film 29 is provided between the substrate 10 and the gate line 31a, and capacitance CS is formed between the gate line 31a and the substrate 10. The first gate electrode 21, the second gate electrode 31, and the gate line 31a are made of aluminum (Al), copper (Cu), silver (Ag), molybdenum (Mo), or an alloy film made of these metals, for example.

The structure of the transistor Tr according to the present embodiment is not limited to a dual-gate structure. The transistor Tr may have a bottom-gate structure in which the gate electrode is composed of only the first gate electrode 21. Alternatively, the transistor Tr may have a top-gate structure in which the gate electrode is composed of only the second gate electrode 31. The undercoat layer 20 is not necessarily provided.

The display device 1 includes an insulating film 35 provided on the first surface 10a of the substrate 10 to cover the transistors Tr. The source electrodes 41s are provided on the insulating film 35 and are each coupled to the source of the corresponding transistor Tr through a through hole formed in the insulating film 35. The drain electrodes 41d are provided on the insulating film 35 and are each coupled to the drain of the corresponding transistor Tr through a through hole formed in the insulating film 35. The cathode wiring 60 is provided on the insulating film 35 in the peripheral region GA. An insulating film 42 covers the source electrodes 41s, the drain electrodes 41d, and the cathode wiring 60. The insulating film 35 is an inorganic insulating film, and the insulating film 42 is an organic insulating film. The source electrode 41s and the drain electrode 41d are multilayered films made of TiAlTi or TiAl, which is a multilayered structure of titanium and aluminum. The insulating film 42 is made of organic material, such as photosensitive acrylic.

Part of the source electrode 41s is formed in a region overlapping the gate line 31a. The capacitance Cs1 is formed by the gate line 31a and the source electrode 41s facing each other with the insulating film 35 interposed therebetween. The gate line 31a is formed in a region overlapping part of the semiconductor layer 25. The capacitance Cs1 includes capacitance formed by the semiconductor layer 25 and the gate line 31a facing each other with the insulating film 24 interposed therebetween.

The display device 1 includes source coupling wiring 43s, drain coupling wiring 43d, an insulating film 45, a counter anode electrode 50e, an insulating film 70, a flattening film 80, a counter cathode electrode 90e, and a cover part 92. The source coupling wiring 43s is provided on the insulating film 42 and is coupled to the source electrode 41s through a through hole formed in the insulating film 42. The drain coupling wiring 43d is provided on the insulating film 42 and is coupled to the drain electrode 41d through a through hole formed in the insulating film 42. The insulating film 45 is provided on the insulating film 42 and covers the source coupling wiring 43s and the drain coupling wiring 43d. The counter anode electrode 50e is provided on the insulating film 45 and is coupled to the drain coupling wiring 43d of the drive transistor DRT through a through hole formed in the insulating film 45. The inorganic light emitter 100 is provided on the counter anode electrode 50e. The counter anode electrode 50e is coupled to the anode electrode 112 of the inorganic light emitter 100. The capacitance Cs2 is formed between the counter anode electrode 50e and the source coupling wiring 43s facing each other with the insulating film 45 interposed therebetween. The source coupling wiring 43s and the drain coupling wiring 43d are made of a transparent electric conductor, such as indium tin oxide (ITO).

The insulating film 70 is provided on the insulating film 45 and covers the side surfaces of the counter anode electrode 50e. The insulating film 70 has an opening for mounting the inorganic light emitter 100 at a position overlapping the counter anode electrode 50e. The area of the opening of the insulating film 70 is larger than the contact area of the inorganic light emitter 100 with the counter anode electrode 50e in planar view. The area of the counter anode electrode 50e is larger than the contact area of the inorganic light emitter 100 with the counter anode electrode 50e in planar view. The flattening film 80 is provided on the insulating film 70 and covers the side surfaces of the inorganic light emitter 100. The counter cathode electrode 90e is provided on the flattening film 80. The insulating film 70 is an inorganic insulating film and is a silicon nitride film (SiN), for example. The flattening film 80 is an organic insulating film or an inorganic-organic hybrid insulating film (made of material in which an organic group (a methyl or phenyl group) is bonded to a main chain of Si—O, for example). The upper surface (cathode electrode 114, refer to FIG. 5) of the inorganic light emitter 100 is exposed from the flattening film 80.

The counter cathode electrode 90e is coupled to the cathode electrode 114 of the inorganic light emitter 100. The counter cathode electrode 90e is coupled to the cathode wiring 60 provided on the array substrate 2 through a contact hole H1 formed outside the display region AA. Specifically, the contact hole H1 is formed in the flattening film 80 and the insulating film 42, and the cathode wiring 14 is provided at the bottom of the contact hole H1. The cathode wiring 60 is provided on the insulating film 35. In other words, the cathode wiring 60 is provided in the same layer and is made of the same material as those of the source electrode 41s and the drain electrode 41d. The counter cathode electrode 90e is continuously provided from the display region AA to the peripheral region GA and is coupled to the cathode wiring 60 at the bottom of the contact hole H1. The cover part 92 is provided on the counter cathode electrode 90e. The cover part 92 is a cover made of a member that allows light to pass therethrough, such as glass. The cover part 92 is not necessarily provided.

While the counter anode electrode 50e according to the present embodiment is directly coupled to the anode electrode 112 of the inorganic light emitter 100, the counter anode electrode 50e and the anode electrode 112 may be coupled with a coupling layer interposed therebetween. For example, an insulating film covering the counter anode electrode 50e is provided on an insulating film 66, and a coupling layer provided on the insulating film is coupled to the counter anode electrode 50e through a through hole formed in the insulating film 66. The anode electrode is provided on the coupling layer. The coupling layer is a conductive member.

Figure 5:
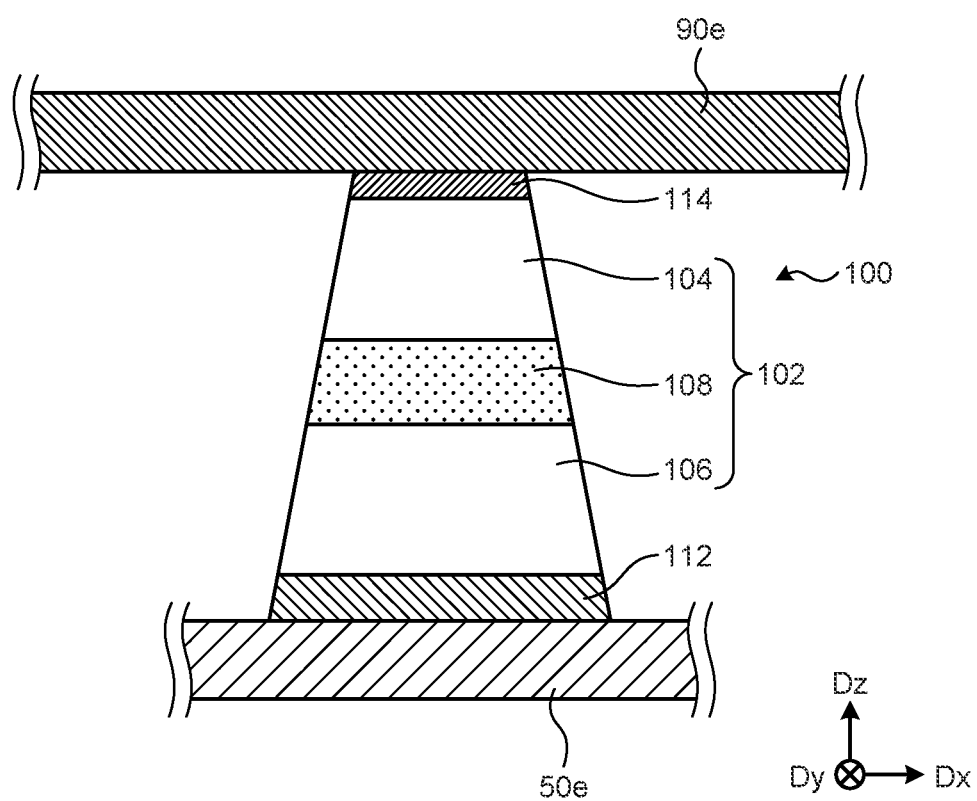
FIG. 5 is a sectional view of an exemplary configuration of an inorganic light emitter according to the present embodiment.

The following describes the configuration of the inorganic light emitter 100. FIG. 5 is a sectional view of an exemplary configuration of the inorganic light emitter according to the present embodiment. As illustrated in FIG. 5, the inorganic light emitter 100 includes an inorganic light-emitting element 102, the anode electrode 112, and the cathode electrode 114.

The inorganic light-emitting element 102 is a light emission layer that emits light. The inorganic light-emitting element 102 includes an n-type cladding layer 104, a p-type cladding layer 106, and a light emission layer 108 provided between the p-type cladding layer 106 and the n-type cladding layer 104. In the inorganic light-emitting element 102 according to the present embodiment, the p-type cladding layer 106, the light emission layer 108, and the n-type cladding layer 104 are stacked in order toward the upper side. The inorganic light-emitting element 102 is made of compound semiconductor, such as gallium nitride (GaN), aluminum indium gallium phosphorous (AlInGaP), aluminum gallium arsenic (AlGaAs), and gallium arsenic phosphorus (GaAsP). More specifically, the p-type cladding layer 106 and the n-type cladding layer 104 according to the present embodiment are made of gallium nitride (GaN), for example. The light emission layer 108 is made of indium gallium nitride (InGaN), for example. The light emission layer 108 may have a multi-quantum well structure (MQW) in which InGaN and GaN are stacked.

In the inorganic light emitter 100, the anode electrode 112, the p-type cladding layer 106, the light emission layer 108, the n-type cladding layer 104, and the cathode electrode 114 are stacked in order toward the upper side. The counter anode electrode 50e is provided under the inorganic light emitter 100, and the counter cathode electrode 90e is provided on the inorganic light emitter 100.

The counter anode electrode 50e includes a conductive member, and more specifically includes metal material in this example. The counter anode electrode 50e according to the present embodiment includes titanium (Ti) and aluminum (Al), and Ti layers and Al layers are stacked along the third direction Dz, for example. The counter anode electrode 50e is provided for each inorganic light emitter 100 (pixel 49) as a pixel electrode.

The anode electrode 110 is provided on the counter anode electrode 50e. The anode electrode 110 is a translucent conductive member, such as ITO. The anode electrode 110 is electrically coupled to the counter anode electrode 50e. The p-type cladding layer 106 is provided on the anode electrode 110. The anode electrode 110 is coupled to the p-type cladding layer 106.

The cathode electrode 114 is provided on the n-type cladding layer 104. The cathode electrode 114 is a translucent conductive member, such as ITO. The cathode electrode 114 is coupled to the counter cathode electrode 90e.

The counter cathode electrode 90e serving as a counter electrode is a translucent conductive member, such as ITO.

The counter cathode electrode 90e is a common electrode shared by a plurality of (in this case, all) the inorganic light emitters 100 (pixels 49) and is coupled to the cathode electrodes 114 of a plurality of (in this case, all) the inorganic light emitters 100.

Repairing the Display Device

The display device 1 having the configuration described above displays an image by emitting light from the inorganic light emitters 100. The display device 1 including the inorganic light emitters 100 is difficult to manufacture and may possibly have defects because of difficulties in mounting the inorganic light emitters 100 due to their small size, for example. If the display device 1 determined to be defective is not used and is discarded, the yield decreases. To address this, the present embodiment repairs the display device 1 determined to be defective, thereby making the defective display device 1 usable and suppressing reduction in yield. Being defective herein refers to a state where at least some of the inorganic light emitters 100 mounted on the display device 1 do not appropriately emit light. The state where the inorganic light emitters 100 do not appropriately emit light includes a dark spot state or a bright spot state. The dark spot state refers to a state where the inorganic light emitter 100 does not emit light when an electric current for causing the inorganic light emitter 100 to emit light is applied thereto. Applying an electric current for causing the inorganic light emitter 100 according to the present embodiment to emit light refers to supplying an electric current corresponding to a display gradation to the inorganic light emitter 100 from the anode power supply line L1 via the drive transistor DRT in a light emission operation period. In this case, an electric current corresponding to the display gradation is supplied from the drive transistor DRT to the anode electrode 112 of the inorganic light emitter 100 via the drain coupling wiring 43d and the counter anode electrode 50e, and the inorganic light emitter 100 normally emits light due to the electric current. In the dark spot state, however, the inorganic light emitter 100 does not emit light when an electric current is supplied to the inorganic light emitter 100 from the anode power supply line L1 via the drive transistor DRT, that is, when an electric current for causing the inorganic light emitter 100 to emit light is applied thereto. By contrast, the bright spot state refers to a state where the inorganic light emitter 100 emits light when no electric current for causing the inorganic light emitter 100 to emit light is applied thereto. In other words, the bright spot state is a state where the inorganic light emitter 100 emits light when no electric current for causing the inorganic light emitter 100 to emit light is applied thereto, that is, when the drive transistor DRT coupled to the inorganic light emitter 100 should be turned off.

Examples of possible defective modes in the dark spot state include, but are not limited to, disconnection between the anode power supply line L1 and the inorganic light emitter 100, poor electrical continuity characteristics of the transistors, mounting failure due to failure in forming the counter cathode electrode 90e, poor characteristics of the inorganic light emitter 100 itself. The mounting failure due to failure in forming the counter cathode electrode 90e out of these defects can be restored to the normal state by the repairing described below.

Examples of possible defective modes in the bright spot state include, but are not limited to, a short-circuit of the power supply due to foreign matter and the like between the anode power supply line L1 and the inorganic light emitter 100, poor switching characteristics of the transistors. In other words, the bright spot state fails to be restored to the normal state by repairing because it is caused by a problem on the substrate. The bright spot, however, can be darkened by the repairing described below. While the dark spot is a defect, the defect of the dark spot is more allowable than the defect of the bright spot in terms of the device quality. Consequently, darkening the bright spot is effective.

The method for repairing the display device 1 according to the present embodiment starts with detecting a defective inorganic light emitter 100A that is an inorganic light emitter 100 having defects out of the inorganic light emitters 100 mounted on the display device 1. The defective inorganic light emitter 100A is an inorganic light emitter 100 in the bright spot state or the dark spot state. The display device 1 according to the present embodiment is manufactured by stacking the counter anode electrode 50e, the inorganic light emitter 100, and the counter cathode electrode 90e on the array substrate 2, for example. In other words, the parts under the counter cathode electrode 90e and the counter cathode electrode 90e of the display device 1 are formed. Subsequently, a lighting inspection is carried out on the display device 1 to detect the defective inorganic light emitter 100A. In the lighting inspection, an electric current for causing the inorganic light emitter 100 to emit light is applied to all the inorganic light emitters 100, for example, and an inorganic light emitter 100 that does not emit light is detected as the defective inorganic light emitter 100A in the dark spot state. In addition, out of the inorganic light emitters 100, an inorganic light emitter 100 that emits light even though no electric current for causing the inorganic light emitter 100 to emit light is applied thereto is detected as the defective inorganic light emitter 100A in the bright spot state.

Figure 7:
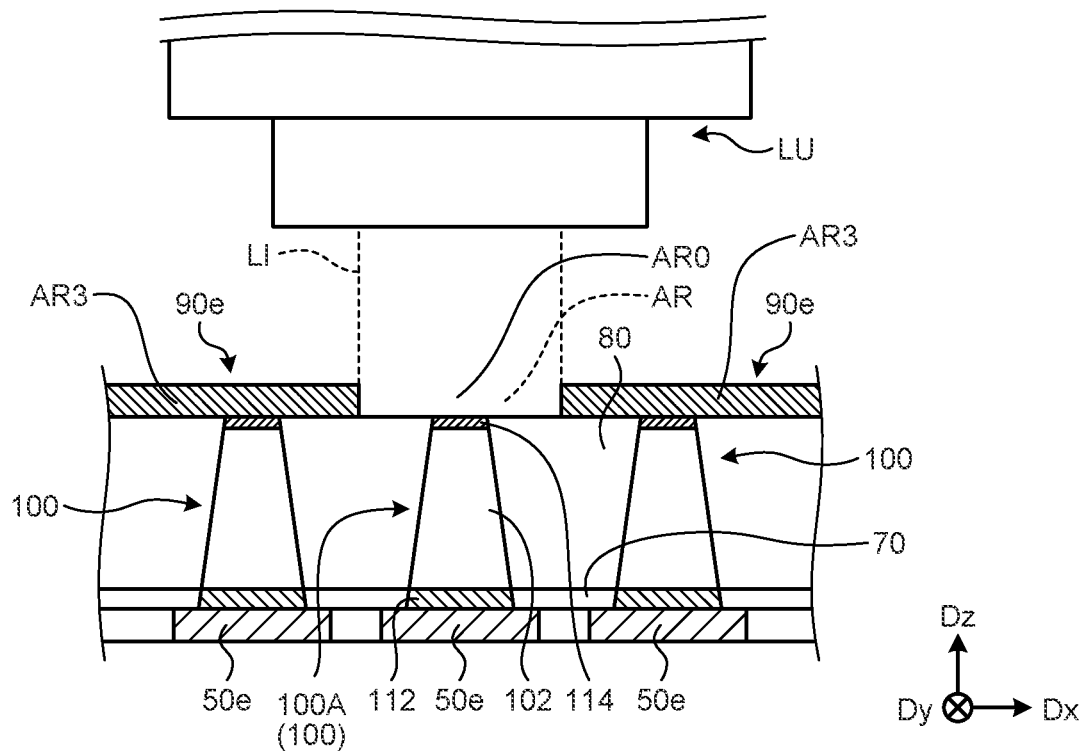
FIG. 7 is a schematic of the example of repairing the display device.

FIGS. 6 and 7 are schematics of an example of repairing the display device. In the method for repairing the display device 1 according to the present embodiment, when the defective inorganic light emitter 100A is detected, a target portion AR corresponding to a portion to be removed in the counter cathode electrode 90e is determined based on the position of the detected defective inorganic light emitter 100A. In other words, the portion to be removed in the counter cathode electrode 90e is determined based on the position of the defective inorganic light emitter 100A in the present repairing method. FIG. 6 is a schematic of the counter cathode electrode 90e viewed from the top, and FIG. 7 is a schematic sectional view of a part near the inorganic light emitters 100. As illustrated in FIG. 6, a portion AR1 and a portion AR2 in the entire region of the counter cathode electrode 90e are determined as the target portion AR in the present repairing method. The portion AR1 is coupled to the defective inorganic light emitter 100A, and the portion AR2 surrounds the outer periphery of the portion AR1.

The portion AR1 is a portion of the counter cathode electrode 90e coupled to the cathode electrode 114 of the defective inorganic light emitter 100A. In other words, the portion AR1 is a portion overlapping the cathode electrode 114 of the defective inorganic light emitter 100A in planar view. The portion AR2 is a portion of the counter cathode electrode 90e surrounding the entire section of the outer periphery of the portion AR1, that is, a portion surrounding the entire periphery of the portion AR1. The portion AR2 does not include the portion coupled to the inorganic light emitter 100. More specifically, when the center point of the defective inorganic light emitter 100A in planar view is defined as a center point Ax, a direction approaching the center point in planar view is referred to as an inner side in the radial direction, and a direction approaching the center point in planar view is referred to as an outer side in the radial direction. In this case, the portion AR2 is positioned on the outer side in the radial direction than the portion AR1 and on the inner side in the radial direction than portions AR3 in planar view. The portions AR3 are portions of the counter cathode electrode 90e coupled to the inorganic light emitters 100A adjacently disposed with the defective inorganic light emitter 100A. More specifically, when the entire section of the outer end (outer periphery) of the portion AR2 is defined as an outer end AR2a, the target portion AR according to the present embodiment is the entire region on the inner side in the radial direction of the outer end AR2a. The outer end AR2a is positioned on the outer side in the radial direction than the portion AR1 and on the inner side in the radial direction than the portions AR3 in planar view. If a plurality of defective inorganic light emitters 100A are selected, the target portions AR are determined for the respective defective inorganic light emitters 100A.

After the position of the target portion AR is determined, the present embodiment outputs light LI to the target portion AR of the counter cathode electrode 90e by a light irradiation device LU as illustrated in FIG. 7. The target portion AR of the counter cathode electrode 90e is removed by being irradiated with the light LI, and a space AR0 is formed. The space AR0 is a space formed by removing the target portion AR of the counter cathode electrode 90e. FIGS. 6 and 7 illustrate the state where the target portion AR is removed, and the space AR0 is formed. In the present repairing method, not only the target portion AR of the counter cathode electrode 90e but also the inorganic light emitter 100 may be irradiated with the light LI. While the light LI decomposes and removes the counter cathode electrode 90e when it is incident on the counter cathode electrode 90e, the light LI does not decompose the inorganic light emitter 100 when it is incident on the inorganic light emitter 100. In other words, if the light LI is incident on the inorganic light emitter 100, the inorganic light emitter 100 is not damaged by the light LI and does not carbonize, for example. The light LI is light with a wavelength in the ultraviolet region, for example, preferably light with a wavelength of 216 nm to 316 nm, and more preferably light with a wavelength of 240 nm to 282 nm. The light LI according to the present embodiment is a laser beam, for example. The present embodiment irradiates one target portion AR with pulsed light LI in one shot and removes the target portion AR. The present embodiment is not limited thereto and may remove the target portion AR by performing scanning with the light LI and moving the trajectory of the light LI on the counter cathode electrode 90e, for example.

In the present repairing method, the target portion AR of the counter cathode electrode 90e is removed as described above. In the present repairing method, the defective inorganic light emitter 100A is left unremoved from the display device 1. In other words, the counter cathode electrode 90e is not provided (is removed) in the target portion AR, and the defective inorganic light emitter 100A is left in the repaired display device 1. In other words, the repaired display device 1 includes the counter cathode electrode 90e, an opening (space AR0) formed in the counter cathode electrode 90e, and the defective inorganic light emitter 100A. The opening (space AR0) is formed at the position described above as the position of the target portion AR. The opening (space AR0) is formed between the portion AR1 provided with the inorganic light emitter 100 (defective inorganic light emitter 100A) and the portions AR3 provided with the inorganic light emitters 100 adjacently disposed with the inorganic light emitter 100 (defective inorganic light emitter 100A) in the planar view, for example.

The target portion AR includes the portion of the counter cathode electrode 90e coupled to the defective inorganic light emitter 100A. Removing the target portion AR uncouples the defective inorganic light emitter 100A from the counter cathode electrode 90e. If the defective inorganic light emitter 100A is in the bright spot state, for example, no electric current flows from the defective inorganic light emitter 100A to the cathode wiring 60 via the counter cathode electrode 90e. As a result, the defective inorganic light emitter 100A is turned off, thereby resolving the bright spot state. While the defective inorganic light emitter 100A is brought into the dark spot state, the defect of the dark spot state is less noticeable than that of the bright spot state of being turned on when unnecessary. Consequently, repairing in this manner can make the display device 1 usable.

Figure 8:
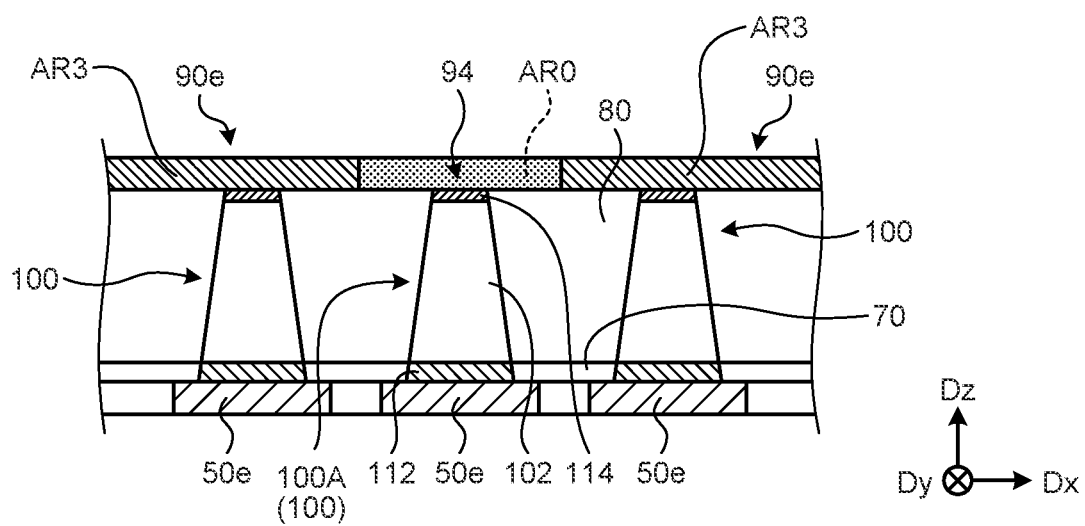
FIG. 8 is a schematic of the example of repairing the display device.
Figure 13:
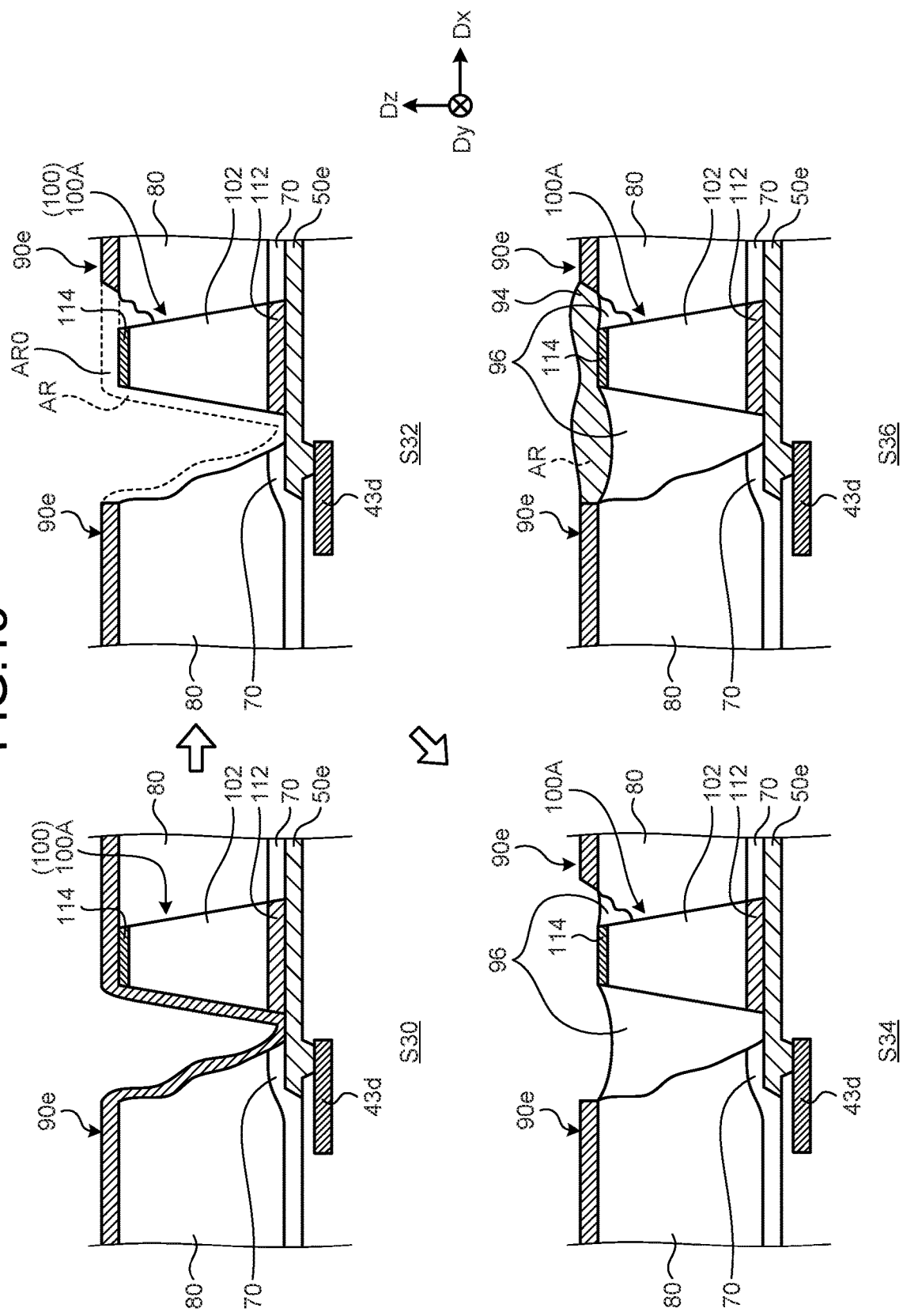
FIG. 13 is a view for explaining a specific example of repairing the display device.

FIG. 8 is a schematic of the example of repairing the display device. In the present repairing method, a conductive member 94 may be provided in the space AR0 formed by removing the target portion AR of the counter cathode electrode 90e as illustrated in FIG. 8, for example. The conductive member 94 is a conductive member having translucency (that allows light from the inorganic light emitter 100 to pass therethrough). The conductive member 94 is preferably made of material different from that of the counter cathode electrode 90e and is made of translucent conductive polymer, for example. In the present repairing method, the conductive member 94 with which the space AR0 is filled comes into contact with the defective inorganic light emitter 100A and the counter cathode electrode 90e. As a result, the defective inorganic light emitter 100A and the counter cathode electrode 90e are electrically coupled via the conductive member 94. If the defective inorganic light emitter 100A serves as the dark spot due to poor coupling between the counter cathode electrode 90e and the defective inorganic light emitter 100A, for example, the conductive member 94 can couple the defective inorganic light emitter 100A and the counter cathode electrode 90e. Consequently, the present repairing method can eliminate the dark spot and make the display device 1 usable. Providing the conductive member 94, however, may possibly not resolve the defect. In the present repairing method, it is preferably determined whether the conductive member 94 may be provided, that is, whether the defective inorganic light emitter 100A and the counter cathode electrode 90e can be recoupled. If it is determined that the conductive member 94 may be provided, the conductive member 94 is provided; and if it is determined that the conductive member 94 should not be provided, the conductive member 94 is not provided. The criteria for determining that the conductive member 94 may be provided can be optionally determined. Typically, it may be determined that the conductive member 94 may be provided if the defect is due to failure in forming the counter cathode electrode 90e. If the counter cathode electrode 90e and the counter anode electrode 50e are short-circuited as illustrated in FIG. 13, which will be described later, for example, it may be determined that the conductive member 94 may be provided after removing the short-circuited counter cathode electrode 90e and covering the exposed counter anode electrode 50e. If the conductive member 94 is provided as described above, the repaired display device 1 includes the counter cathode electrode 90e, the opening (space AR0) formed in the counter cathode electrode 90e, the conductive member 94 provided in the opening, and the defective inorganic light emitter 100A. The opening (space AR0) is formed at the position described above as the position of the target portion AR.

Figure 9:
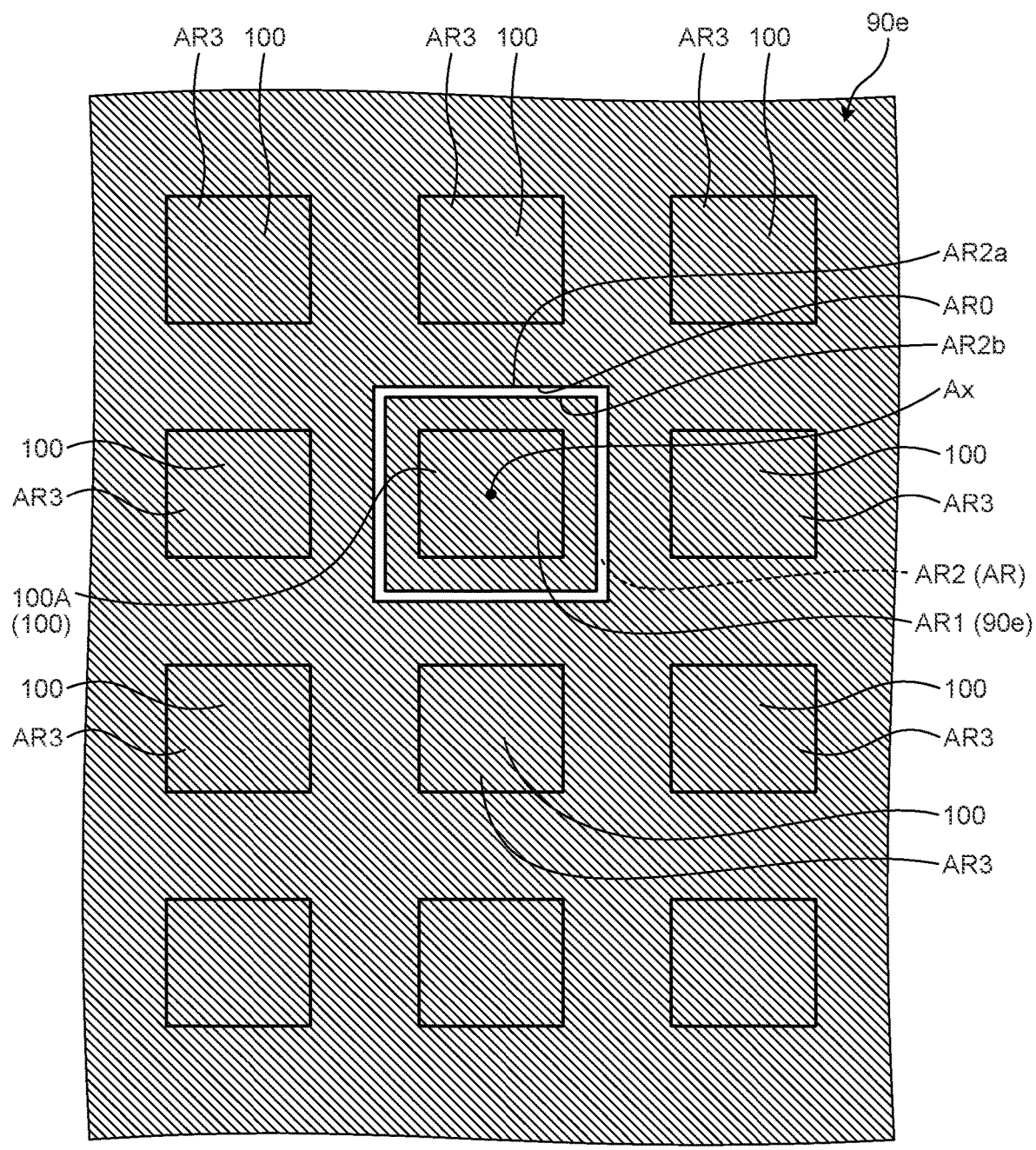
FIG. 9 is a schematic of another example of repairing the display device.
Figure 10:
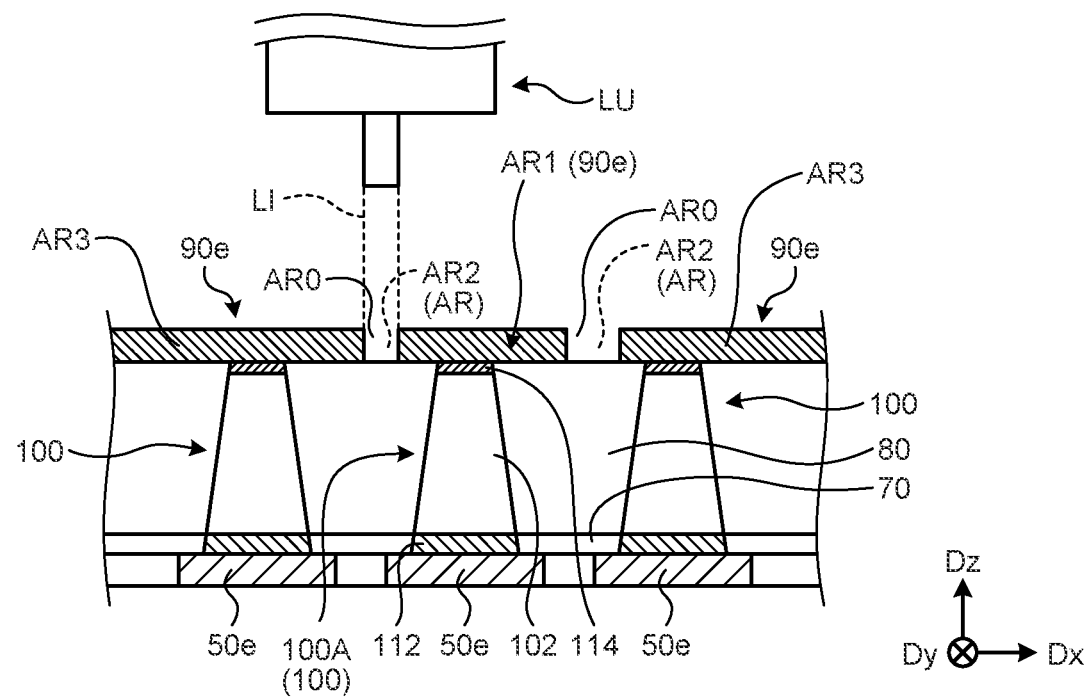
FIG. 10 is a schematic of the example of repairing the display device.

In the description above, the target portion AR of the counter cathode electrode 90e includes the portion AR1 coupled to the defective inorganic light emitter 100A and the portion AR2 positioned on the outer side in the radial direction of the portion AR1. The target portion AR does not necessarily include the portion AR1 and the portion AR2. The target portion AR simply needs to include a portion between the portion AR1 and the portions AR3. FIGS. 9 and 10 are schematics of another example of repairing the display device. As illustrated in FIG. 9, for example, the target portion AR may not include the portion AR1 but includes the portion AR2. The portion AR2 illustrated in FIG. 9 is a portion surrounding the entire periphery of the portion AR1 and positioned on the outer side in the radial direction than the portion AR1 and on the inner side in the radial direction than the portions AR3 in planar view in the entire region of the counter cathode electrode 90e. When the inner end (inner periphery) of the portion AR2 is defined as an inner end AR2b, the inner end AR2b may be positioned on the outer side in the radial direction than the outer periphery of the portion AR1. In other words, the portion AR2 illustrated in FIG. 9 is not coupled to the portion AR1, and the counter cathode electrode 90e is provided between the portion AR2 and the portion AR1. The inner end Ar2b may be provided at the same position as that of the outer periphery of the portion AR1 or on the inner side in the radial direction than the outer periphery of the portion AR1, for example.

In this case, the light LI is output to the target portion AR (portion AR2) of the counter cathode electrode 90e, thereby removing the target portion AR (portion AR2) and forming the space AR0 as illustrated in FIG. 10. If the target portion AR includes only the portion AR2, that is, if the target portion AR has a frame shape, the frame-shaped target portion AR is preferably removed by performing scanning with the light LI and moving the trajectory of the light LI on the counter cathode electrode 90e.

By removing the portion AR2 as the target portion AR, the portion AR1 of the counter cathode electrode 90e coupled to the defective inorganic light emitter 100A is uncoupled from the portion of the counter cathode electrode 90e on the outer side in the radial direction than the target portion AR (space AR0). As a result, the defective inorganic light emitter 100A is uncoupled from the portion of the counter cathode electrode 90e on the outer side in the radial direction than the target portion AR (space AR0). If the defective inorganic light emitter 100A is in the bright spot state, for example, no electric current flows from the defective inorganic light emitter 100A to the counter cathode electrode 90e on the outer side than the target portion AR. As a result, the defective inorganic light emitter 100A is turned off, thereby resolving the bright spot state. In this case, the conductive member 94 is not necessarily formed in the space AR0, and the portion AR1 and the portion of the counter cathode electrode 90e on the outer side in the radial direction than the target portion AR (space AR0) may remain electrically uncoupled.

Figure 11:
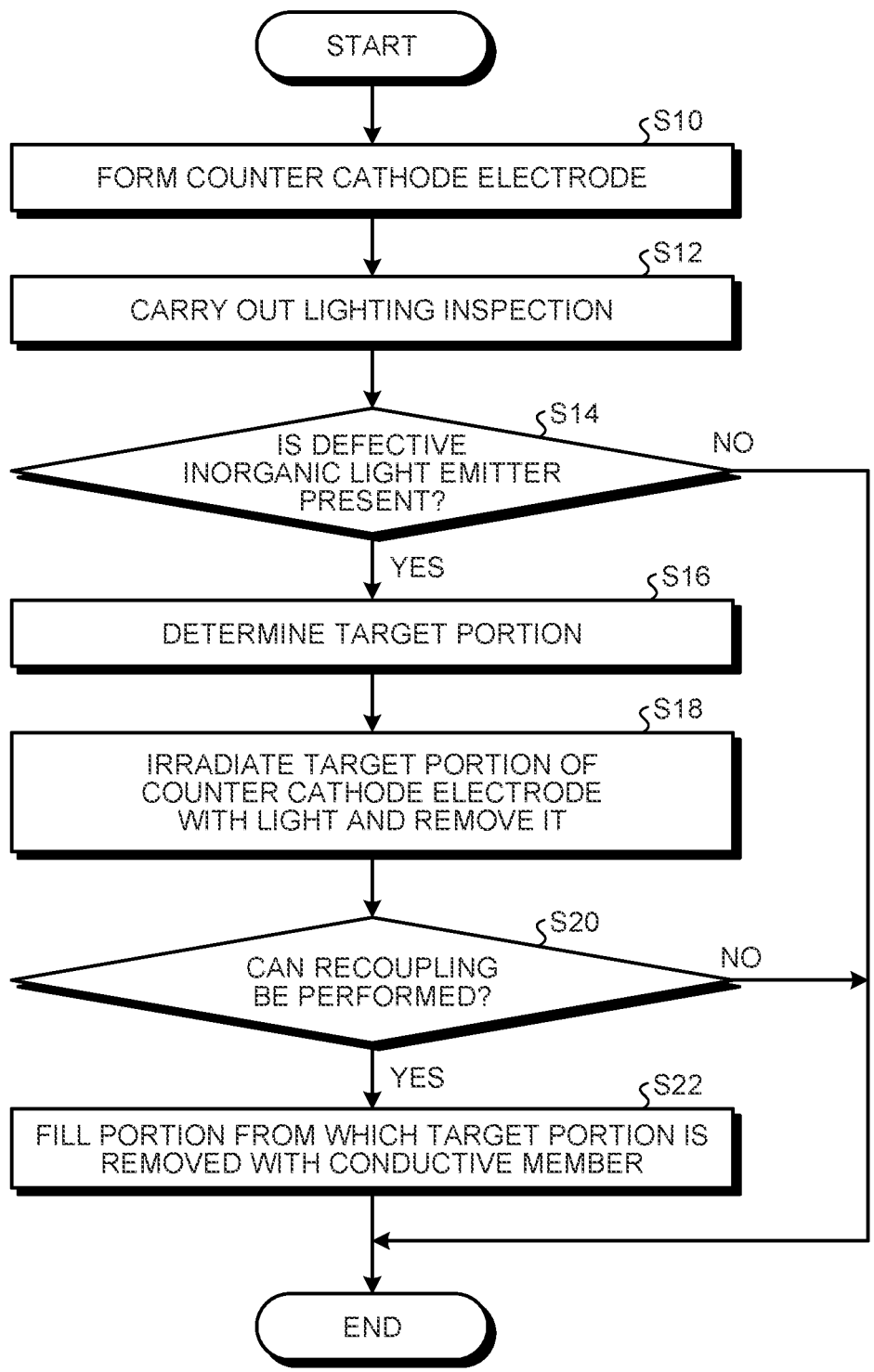
FIG. 11 is a flowchart for explaining a method for repairing the display device according to the present embodiment.
Figure 12:
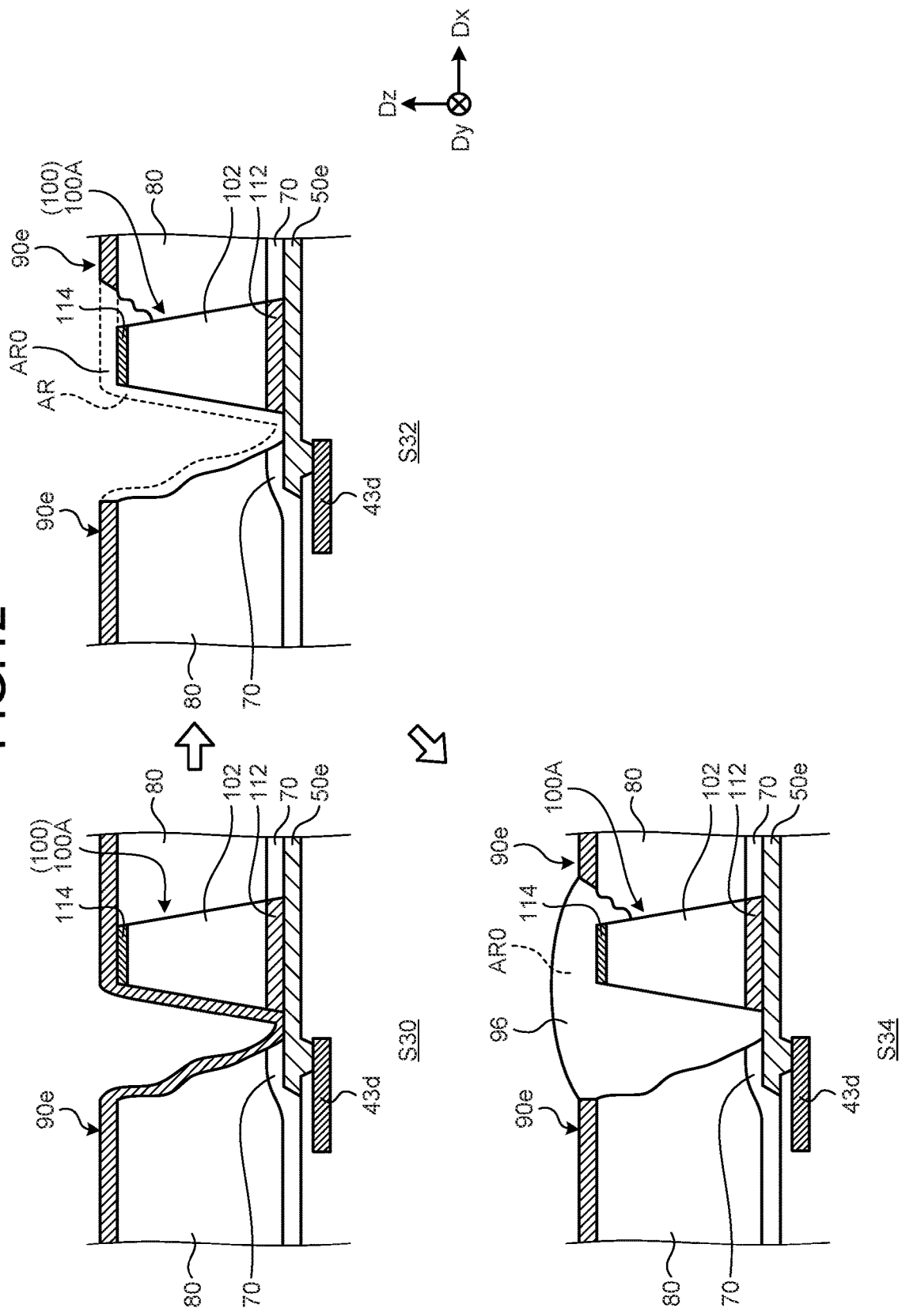
FIG. 12 is a view for explaining a specific example of repairing the display device.

The following describes the method for repairing the display device 1 based on a flowchart. FIG. 11 is a flowchart for explaining the method for repairing the display device according to the present embodiment. As illustrated in FIG. 11, after the counter cathode electrode 90e of the display device 1 is formed (Step S10), that is, after the parts under the counter cathode electrode 90e and the counter cathode electrode 90e of the display device 1 are formed in the present repairing method, a lighting inspection is carried out (Step S12), and it is detected whether the defective inorganic light emitter 100A is present (Step S14; detecting). If the defective inorganic light emitter 100A is detected (Yes at Step S14), the target portion AR of the counter cathode electrode 90e is determined based on the position of the defective inorganic light emitter 100A (Step S16) in the present repairing method. The present embodiment, for example, determines the portion AR1 of the counter cathode electrode 90e coupled to the defective inorganic light emitter 100A and the portion AR2 on the outer side in the radial direction of the portion AR1 as the target portion AR. After the target portion AR is determined, the target portion AR of the counter cathode electrode 90e is irradiated with the light LI and is removed (Step S18) to form the space AR0. As a result, the defective inorganic light emitter 100A and the counter cathode electrode 90e are uncoupled. If a plurality of defective inorganic light emitters 100A are present, the target portions AR are determined for the respective defective inorganic light emitters 100A and are removed. After the target portion AR is removed, it is determined whether recoupling can be performed, that is, whether the conductive member 94 may be provided in the space AR0 (Step S20). If recoupling can be performed (Yes at Step S20), the portion from which the counter cathode electrode 90e is removed, that is, the space AR0 is filled with the conductive member 94 (Step S22). As a result, the defective inorganic light emitter 100A and the counter cathode electrode 90e are coupled via the conductive member 94. If a plurality of defective inorganic light emitters 100A are present, it is determined whether recoupling can be performed for the target portions AR corresponding to the respective defective inorganic light emitters 100A at Step S20, and the spaces AR0 are filled with the conductive member 94.

If the space AR is filled with the conductive member 94 at Step S22, if recoupling cannot be performed (No at Step S20), and if no defective inorganic light emitter 100 is detected (No at Step S14), the present processing is terminated. In this case, a cover part 92 may be formed on the counter cathode electrode 90e to complete the display device 1.

Specific Examples of Repairing

The following describes specific examples of repairing the display device 1. The examples of repairing described below are given by way of example only, and the repairing method is not limited to the examples below.

FIGS. 12 to 15 are views for explaining specific examples of repairing the display device. To manufacture the display device 1, the inorganic light emitter 100 is stacked on the array substrate 2, and an insulating film 70 and a flattening film 80 are then stacked. If the insulating film 70 and the flattening film 80 are not appropriately stacked near the inorganic light emitter 100 as illustrated in Step S30 in FIG. 12, for example, the counter anode electrode 50e under the inorganic light emitter 100 may not be covered with the insulating film 70 or the flattening film 80 and may possibly be exposed. If the counter cathode electrode 90e is formed in this structure, the counter cathode electrode 90e may be formed on the exposed counter anode electrode 50e, and the counter cathode electrode 90e and the counter anode electrode 50e may possibly be coupled. In this case, an electric current flowing through the counter anode electrode 50e does not flow into the inorganic light emitter 100 and is short-circuited to flow into the counter cathode electrode 90e. As a result, no electric current is supplied to the inorganic light emitter 100, thereby bringing the inorganic light emitter 100 into the dark spot state. The inorganic light emitter 100 coupled to the counter anode electrode 50e short-circuited to the counter cathode electrode 90e serves as the defective inorganic light emitter 100A.

If the counter cathode electrode 90e is in direct contact with the counter anode electrode 50e, the portion of the counter cathode electrode 90e coupled to the counter anode electrode 50e is included in the target portion AR as illustrated in Step S32. The target portion AR is removed by being irradiated with the light LI. By removing the target portion AR of the counter cathode electrode 90e, the counter anode electrode 50e is uncoupled from the target cathode electrode 90e, thereby eliminating the short circuit. In addition to the target portion AR of the counter cathode electrode 90e, the flattening film 80 and the insulating film 70 may be irradiated with the light LI to remove the flattening film 80 and the insulating film 70 around the inorganic light emitter 100A.

Subsequently, the portion removed by the light LI, that is, the space AR0 is filled with an insulating member 96 that is a member having insulating properties. More specifically, the part where the flattening film 80 or the insulating film 70 is not stacked around the inorganic light emitter 100 and the part where the flattening film 80 and the insulating film 70 have been removed by being irradiated with the light LI are also filled with the insulating member 96. While the dark spot state of the inorganic light emitter 100A is not resolved in FIG. 12, the short circuit between the counter anode electrode 50e and the counter cathode electrode 90e is eliminated. Consequently, the repairing method can suppress adverse effects of the short circuit and make the display device 1 usable.

As illustrated in FIG. 13, the space AR0 may be filled with the conductive member 94. As a result, the inorganic light emitter 100 and the counter cathode electrode 90e are coupled while eliminating the short circuit between the counter anode electrode 50e and the counter cathode electrode 90e. This repairing method can also resolve the dark spot state. Specifically, the space AR0 is filled with the insulating member 96 such that the cathode electrode 114 of the defective inorganic light emitter 100A remains exposed as illustrated in Step S34 in FIG. 13. In other words, the space where the portion AR of the counter cathode electrode 90e coupled to the defective inorganic light emitter 100A has been present is not filled with the insulating member 96.

Subsequently, as illustrated in Step S36, the conductive member 96 is provided in the space above the cathode electrode 114 exposed without being covered with the insulating member 96, that is, the space where the portion AR of the counter cathode electrode 90e coupled to the defective inorganic light emitter 100A has been present, and the space thereabout. As a result, the remaining counter cathode electrode 90e and the cathode electrode 114 of the defective inorganic light emitter 100A are coupled by the conductive member 96. Carrying out the process described above can not only eliminate the short circuit between the counter anode electrode 50e and the counter cathode electrode 90e but also couple the inorganic light emitter 100 to the counter cathode electrode 90e, thereby resolving the dark spot state.

Figure 14:
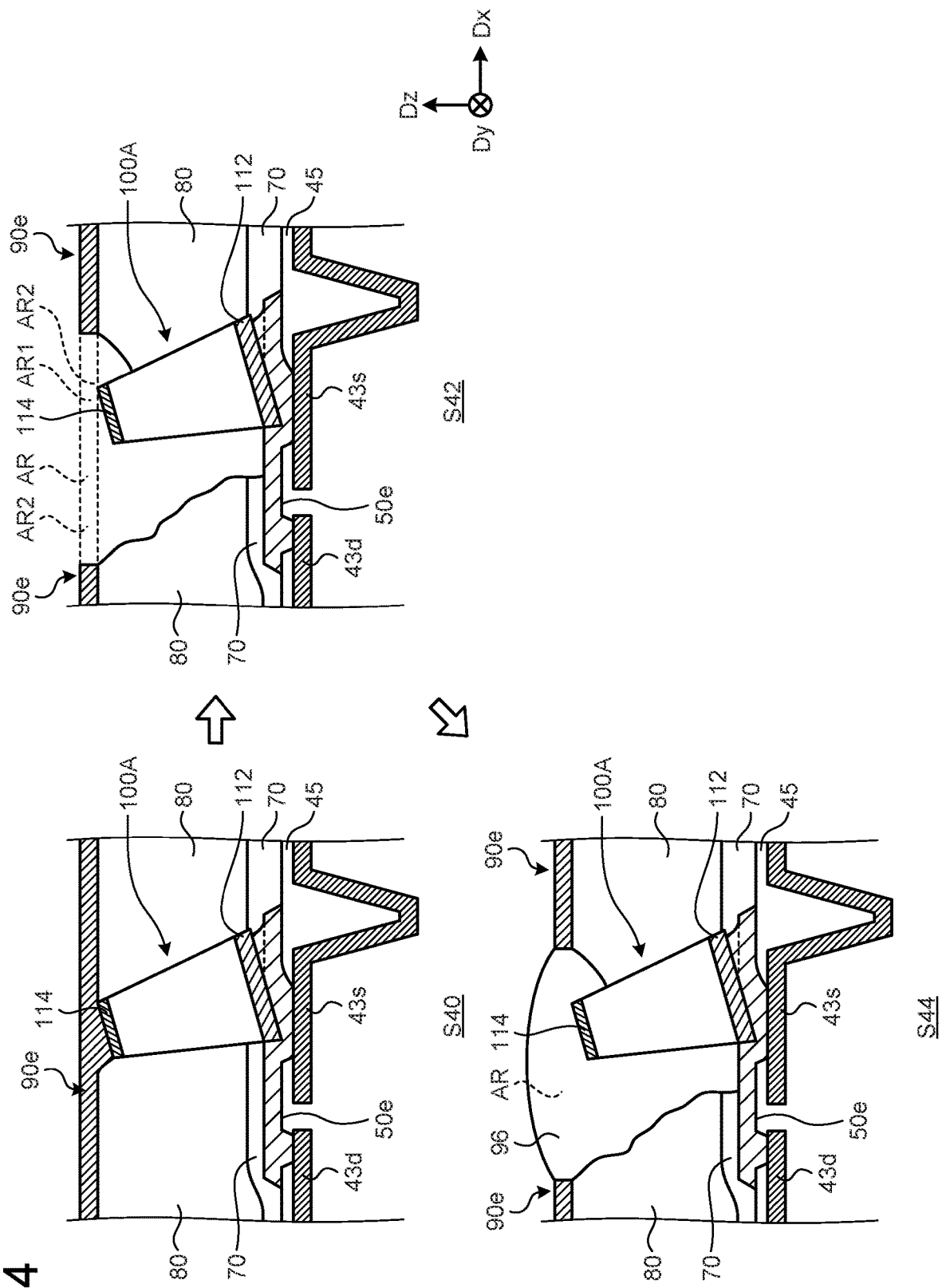
FIG. 14 is a view for explaining a specific example of repairing the display device.

Step S40 in FIG. 14 illustrates another specific example of the defect. If an extra load is applied to the inorganic light emitter 100 when stacking the inorganic light emitter 100, for example, the counter anode electrode 50e under the inorganic light emitter 100 may possibly be pushed down by the inorganic light emitter 100 as illustrated in Step S40 in FIG. 14. In this case, the insulating film 45 under the counter anode electrode 50e may possibly be broken. As a result, the counter anode electrode 50e comes into contact with an electrode under the insulating film 45, resulting in a short circuit between the electrode and the counter anode electrode 50e. While the counter anode electrode 50e and the source coupling wiring 43s are in contact and short-circuited in the example illustrated in FIG. 14, the electrode in contact with the counter anode electrode 50e is not limited to the source coupling wiring 43s. The electrode simply needs to be an electrode that forms the capacitance Cs2 with the counter anode electrode 50e, for example. If a high potential (e.g., the anode power supply potential PVDD) is applied to the electrode under the insulating film 45 when the counter anode electrode 50e and the electrode are short-circuited, the inorganic light emitter 100 (defective inorganic light emitter 100A) coupled to the counter anode electrode 50e is brought into the bright spot state. If a low potential (e.g., the cathode power supply potential PVSS) is applied to the electrode, the inorganic light emitter 100 (defective inorganic light emitter 100A) coupled to the counter anode electrode 50e is brought into the dark spot state.

If the counter anode electrode 50e is in direct contact with the electrode under the insulating film 45, the portion AR1 of the counter cathode electrode 90e coupled to the defective inorganic light emitter 100A and the portion AR2 around the portion AR1 are removed as the target portion AR by being irradiated with the light LI as illustrated in Step S42. While the flattening film 80 and the insulating film 70 around the defective inorganic light emitter 100A are also removed at Step S42, they are not necessarily removed.

Subsequently, as illustrated in Step S44, the portion (space AR0) removed by being irradiated with the light LI is filled with the insulating member 96. This processing can uncouple the defective inorganic light emitter 100A from the counter cathode electrode 90e, thereby resolving the bright spot state, for example. In this case, the counter anode electrode 50e and the electrode under the insulating film 45 remain short-circuited, and a through-current flows in the light emission operation period. The through-current, however, can be ignored because its value is small.

Figure 15:
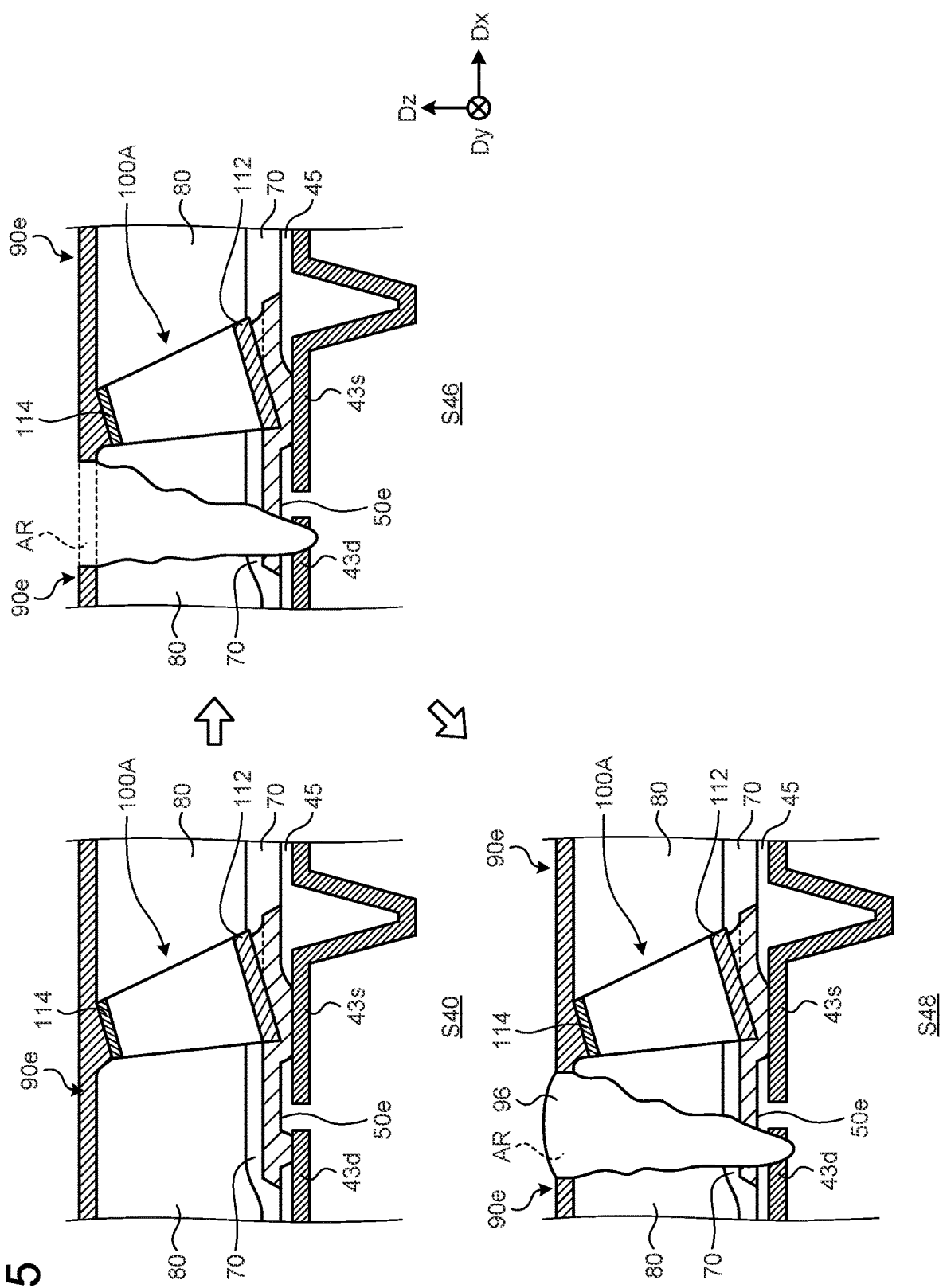
FIG. 15 is a view for explaining a specific example of repairing the display device.

FIG. 15 illustrates another example of repairing when the counter anode electrode 50e is in direct contact with the electrode under the insulating film 45. If the counter anode electrode 50e is in direct contact with the electrode under the insulating film 45, at least part of the counter anode electrode 50e coupled to the defective inorganic light emitter 100A is removed by being irradiated with the light LI as illustrated in Step S46 in FIG. 15. More specifically, the coupling part of the counter anode electrode 50e coupled to the defective inorganic light emitter 100A to the drain coupling wiring 43d is removed by being irradiated with the light LI. The portions facing the upper side of the counter anode electrode 50e in the flattening film 80, the insulating film 70, and the counter cathode electrode 90e provided on the counter anode electrode 50e are also irradiated with the light LI. As a result, these portions are also removed. In this case, the target portion AR corresponds to the portion of the counter cathode electrode 90e overlapping the coupling part of the counter anode electrode 50e to the drain coupling wiring 43d in planar view. The target portion AR (portion overlapping the coupling part of the counter anode electrode 50e to the drain coupling wiring 43d) does not surround the portion AR1 coupled to the defective inorganic light emitter 100A. The target portion AR is a portion between the portion AR1 and the portion AR3 coupled to the next inorganic light emitter 100A. Also in this case, the target portion AR may include the portion AR1 and the portion AR2 around the portion AR1. In other words, the portion of the counter cathode electrode 90e coupled to the defective inorganic light emitter 100A and the portion therearound may also be removed.

After the coupling part of the counter anode electrode 50e to the drain coupling wiring 43d is removed, the portion removed by being irradiated with the light LI is filled with the insulating member 96 as illustrated in Step S48. By removing the coupling part of the counter anode electrode 50e to the drain coupling wiring 43d, the drive transistor DRT and the counter anode electrode 50e are uncoupled. As a result, no electric current is supplied to the counter anode electrode 50e, thereby resolving the bright spot state and suppressing the through-current described above.

As described above, the method for repairing the display device 1 according to the present embodiment is a method for repairing the display device 1 including a plurality of inorganic light emitters 100 and a counter electrode (counter cathode electrode 90e). The inorganic light emitters 100 are arrayed in a matrix (row-column configuration). The counter electrode (counter cathode electrode 90e) is provided in a traveling direction of light emitted from the inorganic light emitters 100 and is coupled to the inorganic light emitters 100. The present repairing method includes detecting the defective inorganic light emitter 100A, and removing the target portion AR of the counter electrode (counter cathode electrode 90e) by irradiating the target portion AR with the light LI while leaving the defective inorganic light emitter 100A unremoved. The target portion AR includes a portion of the counter electrode (counter cathode electrode 90e) between the portion AR1 coupled to the defective inorganic light emitter 100A and the portions AR3 coupled to the inorganic light emitter 100 adjacently disposed with the defective inorganic light emitter 100A.

In the repairing method according to the present embodiment, the portion of the counter cathode electrode 90e between the portions AR1 and AR3 is removed. Consequently, the repairing method can eliminate defects of the display device 1 and appropriately make the display device 1 usable if it has defects. Because the defective inorganic light emitter 100A is left unremoved, the repairing method does not require the process of removing the defective inorganic light emitter 100A, thereby facilitating the repairing. Providing the conductive member 94, for example, can eliminate defects without replacing the defective inorganic light emitter 100A and appropriately turn it on.

The target portion AR includes the portion AR2 surrounding the outer periphery of the portion AR1 of the counter electrode (counter cathode electrode 90e). In the repairing method according to the present embodiment, the defective inorganic light emitter 100A is uncoupled from the portion outside the target portion AR of the counter electrode (counter cathode electrode 90e) by removing the target portion AR at the removing. In the repairing method according to the present embodiment, the defective inorganic light emitter 100A is uncoupled from the counter cathode electrode 90e outside the target portion AR. As a result, an electric current is prevented from flowing from the defective inorganic light emitter 100A to the counter cathode electrode 90e outside the target portion AR, thereby appropriately resolving the bright spot state, for example.

The target portion AR includes the portion AR1 of the counter electrode (counter cathode electrode 90e) coupled to the defective inorganic light emitter 100A. The defective inorganic light emitter 100A and the counter electrode (counter cathode electrode 90e) are uncoupled by removing the target portion AR at the removing. In the repairing method according to the present embodiment, an electric current is prevented from flowing from the defective inorganic light emitter 100A to the counter cathode electrode 90e, thereby appropriately resolving the bright spot state, for example.

At the removing, at least part of an electrode coupled to the inorganic light emitter 100 on the side opposite to the counter electrode (counter cathode electrode 90e) is also irradiated with light and is removed. As a result, a short circuit between the counter anode electrode 50e and the electrode under the insulating film 45 can be suppressed, for example.

The repairing method according to the present embodiment further includes recoupling of providing the conductive member 94 in the space AR0 formed by removing the counter electrode (counter cathode electrode 90e) at the removing and electrically coupling the defective inorganic light emitter 100A to the counter electrode (counter cathode electrode 90e) via the conductive member 94. The recoupling can appropriately resolve the dark spot state, for example.

In the repairing method according to the present embodiment, at least one of the inorganic light emitter 100 that does not emit light when an electric current for causing the inorganic light emitter 100 to emit light is applied thereto and the inorganic light emitter 100 that emits light when no electric current for causing the inorganic light emitter 100 to emit light is applied thereto as the defective inorganic light emitter 100A at the detecting. In other words, the dark spot state and the bright spot state are detected to repair the defective inorganic light emitter 100A in those states. Consequently, the display device 1 can be appropriately made usable if it is in the bright spot state or the dark spot state.

The repaired display device 1 according to the present embodiment includes a plurality of inorganic light emitters 100 and a counter electrode (counter cathode electrode 90e). The inorganic light emitters 100 are arrayed in a matrix (row-column configuration). The counter electrode (counter cathode electrode 90e) is provided in a traveling direction of light emitted from the inorganic light emitters 100 and is coupled to the inorganic light emitters 100. The counter electrode (counter cathode electrode 90e) has an opening (space AR0) at a portion provided with a first inorganic light emitter 100 and a portion provided with a second inorganic light emitter 100 adjacently disposed with the first inorganic light emitter 100 when viewed from the traveling direction of light emitted from the inorganic light emitters 100, that is, in planar view. The display device 1 is appropriately repaired and can be appropriately made usable if it has defects, for example.

Out of other advantageous effects provided by the aspects described in the present embodiment, advantageous effects clearly defined by the description in the present specification or appropriately conceivable by those skilled in the art are naturally provided by the present invention.

What is claimed is:

1. A method for repairing a display device, the display device comprising:
 a plurality of inorganic light emitters arrayed in a matrix (row-column configuration);
 a flattering film around the plurality of inorganic light emitters; and
 a counter electrode provided in a traveling direction of light emitted from the inorganic light emitters and coupled to the inorganic light emitters,
 the method comprising steps of:
 detecting a defective inorganic light emitter serving as one of the inorganic light emitters and having a defect;

removing a target portion including the counter electrode and the flattering film by irradiating the target portion with light while leaving the defective inorganic light emitter unremoved, the target portion including a portion between a portion coupled to the defective inorganic light emitter and a portion coupled to an inorganic light emitter adjacently disposed with the defective inorganic light emitter; and filling an insulating member in a space of the target portion formed by removing the counter electrode and the flattering film.

2. The method according to claim 1, wherein the target portion includes a portion surrounding an outer periphery of the portion of the counter electrode coupled to the defective inorganic light emitter, and the defective inorganic light emitter is uncoupled from a portion outside the target portion of the counter electrode by removing the target portion at the removing.

3. The method according to claim 1, wherein the target portion includes the portion of the counter electrode coupled to the defective inorganic light emitter, and the defective inorganic light emitter and the counter electrode are uncoupled by removing the target portion at the removing.

4. The method according to claim 1, wherein at least part of an electrode coupled to the inorganic light emitter on a side opposite to the counter electrode is irradiated with light and is removed at the removing.

5. The method according to claim 1, further comprising recoupling of providing a conductive member in a space formed by removing the counter electrode at the removing and electrically coupling the defective inorganic light emitter to the counter electrode via the conductive member.

6. The method according to claim 1, wherein at least one of the inorganic light emitter configured not to emit light when an electric current for causing the inorganic light emitter to emit light is applied to the inorganic light emitter and the inorganic light emitter configured to emit light when no electric current for causing the inorganic light emitter to emit light is applied to the inorganic light emitter is detected as the defective inorganic light emitter at the detecting.

7. A display device comprising:
a plurality of inorganic light emitters arrayed in a matrix (row-column configuration);
a flattering film around the plurality of inorganic light emitters; and
a counter electrode provided in a traveling direction of light emitted from the inorganic light emitters and coupled to the inorganic light emitters, wherein
the counter electrode has an opening at a portion provided with a first inorganic light emitter and a portion provided with a second inorganic light emitter adjacently disposed with the first inorganic light emitter when viewed from the traveling direction of light,
the flattering film has a space around the first inorganic light emitter, and
the space is filled by an insulating member.

* * * * *